US009443852B2

(12) United States Patent
Jeong et al.

(10) Patent No.: US 9,443,852 B2
(45) Date of Patent: Sep. 13, 2016

(54) INTEGRATED CIRCUIT DEVICES WITH SOURCE/DRAIN REGIONS INCLUDING MULTIPLE SEGMENTS

(71) Applicants: Yeong-Jong Jeong, Yongin-si (KR); Jeong-Yun Lee, Yongin-si (KR); Dong-Hyun Kim, Siheung-si (KR); Bok-Young Lee, Seoul (KR)

(72) Inventors: Yeong-Jong Jeong, Yongin-si (KR); Jeong-Yun Lee, Yongin-si (KR); Dong-Hyun Kim, Siheung-si (KR); Bok-Young Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/625,070

(22) Filed: Feb. 18, 2015

(65) Prior Publication Data

US 2015/0236015 A1 Aug. 20, 2015

(30) Foreign Application Priority Data

Feb. 19, 2014 (KR) ........................ 10-2014-0019114

(51) Int. Cl.

| | |
|---|---|
| ***H01L 29/76*** | (2006.01) |
| ***H01L 29/94*** | (2006.01) |
| ***H01L 31/062*** | (2012.01) |
| ***H01L 31/113*** | (2006.01) |
| ***H01L 31/119*** | (2006.01) |
| ***H01L 27/088*** | (2006.01) |
| ***H01L 29/08*** | (2006.01) |
| ***H01L 29/423*** | (2006.01) |
| ***H01L 21/8238*** | (2006.01) |
| ***H01L 29/78*** | (2006.01) |
| ***H01L 27/092*** | (2006.01) |

(52) U.S. Cl.

CPC ... *H01L 27/0886* (2013.01); *H01L 21/823814* (2013.01); *H01L 21/823821* (2013.01); *H01L 27/0924* (2013.01); *H01L 29/0847* (2013.01); *H01L 29/42356* (2013.01); *H01L 29/785* (2013.01)

(58) Field of Classification Search

CPC ..... H01L 29/76; H01L 29/94; H01L 31/062; H01L 31/113; H01L 31/119; H01L 29/66636; H01L 29/7851; H01L 29/7848; H01L 21/02529; H01L 21/02521

See application file for complete search history.

(56) References Cited

U.S. PATENT DOCUMENTS

| | | | |
|---|---|---|---|
| 6,383,938 B2 | 5/2002 | Pandhumsoporn et al. | |
| 7,074,682 B2 | 7/2006 | Kim et al. | |
| 7,279,774 B2 | 10/2007 | Seo et al. | |
| 7,410,854 B2 | 8/2008 | Yao et al. | |
| 7,615,817 B2 | 11/2009 | Moon et al. | |
| 7,675,110 B2 | 3/2010 | Uchiyama | |
| 8,071,481 B2 | 12/2011 | Kao et al. | |
| 8,264,034 B2 | 9/2012 | Kim et al. | |
| 2011/0266618 A1 | 11/2011 | Kawashima | |
| 2011/0316075 A1 | 12/2011 | Hsieh | |
| 2012/0091538 A1* | 4/2012 | Lin | H01L 29/66795 257/401 |
| 2012/0161238 A1 | 6/2012 | Scheiper et al. | |
| 2012/0322268 A1 | 12/2012 | Kim et al. | |
| 2013/0001591 A1 | 1/2013 | Wu et al. | |
| 2013/0153971 A1 | 6/2013 | Guillorn et al. | |
| 2014/0042500 A1* | 2/2014 | Wann | H01L 29/41791 257/288 |
| 2015/0187571 A1* | 7/2015 | Fan | H01L 29/0653 257/401 |
| 2015/0187943 A1* | 7/2015 | Lee | H01L 29/66636 257/192 |

FOREIGN PATENT DOCUMENTS

KR 1020050040642 5/2005

* cited by examiner

*Primary Examiner* — Phuc Dang

(74) *Attorney, Agent, or Firm* — Myers Bigel & Sibley, P.A.

(57) ABSTRACT

Integrated circuit devices with source/drain regions including multiple segments and methods of forming the same are provided. The integrated circuit devices may include a gate structure on a substrate and a source/drain region in the substrate adjacent the gate structure. The source/drain region may include a sidewall including a plurality of curved sidewall sections.

20 Claims, 35 Drawing Sheets

1400

INTEGRATED CIRCUIT DEVICES WITH SOURCE/DRAIN REGIONS INCLUDING MULTIPLE SEGMENTS

CROSS-REFERENCE TO RELATED APPLICATION

This U.S. non-provisional application claims priority under 35 U.S.C. §119 to Korean Patent Application No. 10-2014-0019114, filed on Feb. 19, 2014, in the Korean Intellectual Property Office, the disclosure of which is hereby incorporated by reference herein in its entirety.

BACKGROUND

The present disclosure generally relates to the field of electronics and, more particularly, to integrated circuit devices.

Multi-gate transistors may be used for high density integrated circuit devices. Some of the multi-gate transistors may include a silicon body disposed on a substrate and a gate disposed on a surface of the silicon body.

Some of the multi-gate transistors may use a three-dimensional (3D) channel and may thus be easily scaled down. Further, the multi-gate transistors may have improved current control capability without increasing a gate length. Still further, the multi-gate transistors may reduce a short channel effect (SCE).

SUMMARY

A semiconductor device may include an active fin protruding from a substrate in a first direction and extending in a second direction crossing the first direction. The device may also include a gate electrode disposed on the active fin extending in a third direction crossing the second direction, a trench in the active fin adjacent the gate electrode and a semiconductor pattern in the trench. The semiconductor pattern may include a first segment and a second segment, and the first segment may be disposed between the gate electrode and the second segment. The first segment may have a first maximum width in the second direction that may be different from a second maximum width of the second segment in the second direction. The first segment may have a first maximum thickness in the first direction that may be different from a second maximum thickness of the second segment in the first direction.

According to some embodiments, the first maximum width may be smaller than the second maximum width. In some embodiments, the first maximum thickness may be smaller than the second maximum thickness.

According to some embodiments, the first maximum thickness may be greater than the second maximum thickness. In some embodiments, the first maximum width may be greater than the second maximum width.

According to some embodiments, the semiconductor pattern may further include a third segment disposed under the second segment. The second segment may be disposed between the first segment and the third segment, and third segment may have a third maximum width in the second direction that may be different from the second maximum width of the second segment.

In some embodiments, the first maximum width may be smaller than the second maximum width that may be smaller than the third maximum width.

In some embodiments, the first maximum width may be greater than the second maximum width that may be greater than the third maximum width.

In some embodiments, the first maximum width may be greater than the second maximum width that may be smaller than the third maximum width.

According to some embodiments, the device may further include a gate insulation layer disposed between the gate electrode and the active fin. The gate insulation layer may overlie a side of the gate electrode.

A semiconductor device may include a substrate including a first region and a second region, a first active fin protruding from the substrate in a first direction and extending in a second direction crossing the first direction and a second active fin protruding from the substrate in the first direction and extending in the second direction. The first active fin may be disposed in the first region, and the second active fin may be disposed in the second region. The device may also include a first trench in the first active fin, a second trench in the second active fin, a first semiconductor pattern in the first trench and a second semiconductor pattern in the second trench. The first semiconductor pattern may include a first plurality of segments disposed along the first direction, and the second semiconductor pattern may include a second plurality of segments disposed along the first direction. The first semiconductor pattern and the second semiconductor pattern may have different shapes.

According to some embodiments, maximum widths of respective ones of the first plurality of segments in the second direction may increase monotonically from a top surface to a bottom surface of the first active fin, and maximum widths of respective ones of the second plurality of segments in the second direction may increase monotonically from a top surface to a bottom surface of the second active fin.

According to some embodiments, maximum widths of respective ones of the first plurality of segments in the second direction may increase monotonically from a top surface to a bottom surface of the first active fin, and maximum widths of respective ones of the second plurality of segments in the second direction may be substantially equal to one another.

In some embodiments, maximum widths of respective ones of the first plurality of segments in the second direction may decrease monotonically from a top surface to a bottom surface of the first active fin, and maximum widths of respective ones of the second plurality of segments in the second direction may be substantially equal to one another.

According to some embodiments, the first semiconductor pattern and the second semiconductor pattern may have different conductivity types.

In some embodiments, the device may further include a first gate electrode on the first active fin adjacent the first trench and a second gate electrode on the second active fin adjacent the second trench. The first gate electrode may extend in a third direction crossing the second direction, and the second gate electrode may extend in the third direction. The first gate electrode and the second gate electrode may have different gate pitches.

A method for fabricating a semiconductor device may include forming an active fin protruding from a substrate in a first direction and extending in a second direction crossing the first direction and forming a dummy gate electrode on the active fin. The method may also include sequentially performing a first etching process and a second etching process to form a first trench in the active fin adjacent the dummy gate electrode. The first etching process may be performed using a first etchant for a first duration and the second etching process may be performed using a second etchant for a second duration. The method may further include sequentially performing a third etching process and a fourth etching process to form a second trench in the active fin under the first trench. The third etching process may be performed using a third etchant for a third duration and the fourth etching process may be performed using a fourth etchant for a fourth duration. The first, second, third and fourth etching processes may be performed in one chamber.

In some embodiments, each of the first etching process and the third etching process may include an anisotropic etching process and each of the second etching process and the fourth etching process may include an isotropic etching process.

According to some embodiments, a concentration of the first etchant may be different from a concentration of the third etchant, and a concentration of the second etchant may be different from a concentration of the fourth etchant.

According to some embodiments, the concentration of the first etchant may be lower than the concentration of the third etchant, and the concentration of the second etchant may be lower than the concentration of the fourth etchant.

In some embodiments, the first duration may be different from the third duration, and the second duration may be different from the fourth duration.

According to some embodiments, the first duration may be longer than the third duration, and the second duration may be longer than the fourth duration.

In some embodiments, the method may additionally include performing a first passivation process on the active fin after performing the second etching process and performing a second passivation process on the active fin after performing the fourth etching process.

According to some embodiments, the method may additionally include forming a spacer on a side of the dummy gate electrode. The spacer may be formed concurrently when the first and second trenches are formed.

A method for fabricating a semiconductor device may include forming an active pattern in a substrate, sequentially performing a first anisotropic etching process and a first isotropic etching process on the substrate to form a first trench in the active pattern and performing a first passivation process on the active pattern including the first trench. The method may also include, after performing the first passivation process, sequentially performing a second anisotropic etching process and a second isotropic etching process on the substrate to form a second trench in the active pattern under the first trench and performing a second passivation process on the active pattern including the second trench. The first anisotropic etching process and the second anisotropic etching process may be performed under different processing conditions and the first isotropic etching process and the second isotropic etching process may be performed under different processing conditions. The first and second anisotropic etching processes, the first and second isotropic etching processes and the first and second passivation processes may be performed in one chamber.

An integrated circuit device may include a gate structure on a substrate and a source/drain region in the substrate adjacent the gate structure. The source/drain region may include a sidewall including a plurality of curved sidewall sections.

According to some embodiments, each of the plurality of curved sidewall sections may be convex.

According to some embodiments, the source/drain region may include a plurality of segments bounded by respective ones of the plurality of curved sidewall sections. A first one of the plurality of segments may have a first maximum width, and a second one of the plurality of segments may have a second maximum width that may be greater than the first maximum width.

In some embodiments, the first one of the plurality of segments may have a first thickness, and the second one of the plurality of segments may have a second thickness that may be greater than the first thickness.

In some embodiments, the first one of the plurality of segments may be disposed between the gate structure and the second one of the plurality of segments.

According to some embodiments, the source/drain region may include a plurality of segments bounded by respective ones of the plurality of curved sidewall sections. A first one of the plurality of segments may have a first maximum width, and a second one of the plurality of segments may have a second maximum width that may be substantially equal to the first maximum width.

According to some embodiments, the source/drain region may include a plurality of segments bounded by the respective plurality of curved sidewall sections. The plurality of segments may be disposed along a direction substantially perpendicular to a surface of the substrate. The plurality of segments may have respective maximum widths that may decrease monotonically along the direction.

An integrated circuit device may include a gate structure on a surface of a substrate and a source/drain region in the substrate adjacent the gate structure. The source/drain region may include a plurality of segments disposed along a direction substantially perpendicular to the surface of the substrate, and each of the plurality of segments may have a width that varies non-monotonically along the direction.

In some embodiments, each of the plurality of segments may have a convex sidewall.

According to some embodiments, a first one of the plurality of segments may have a first maximum width, and a second one of the plurality of segments may have a second maximum width that may be greater than the first maximum width.

According to some embodiments, the first one of the plurality of segments may have a first thickness, and the second one of the plurality of segments may have a second thickness that may be greater than the first thickness.

DETAILED DESCRIPTION

Figure 1:
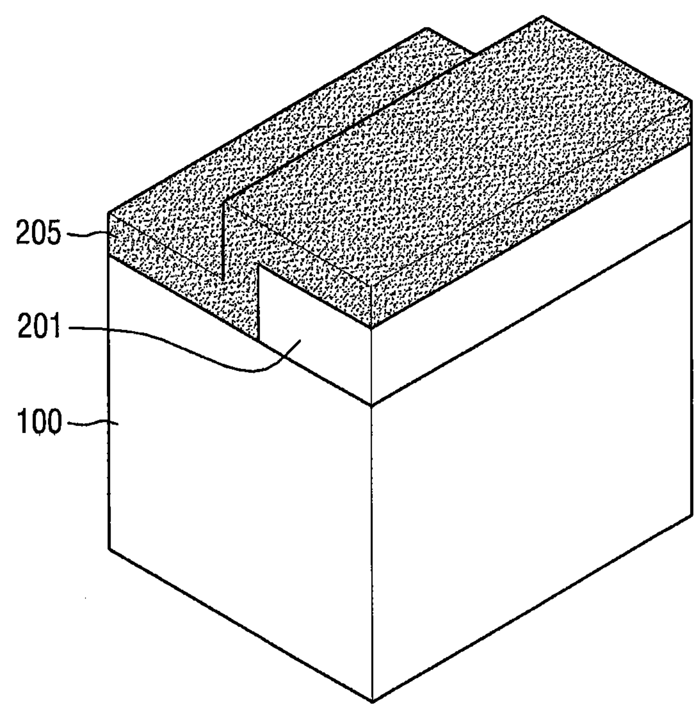
FIGS. 1 through 6, 8, 9A, 12A, 13 and 14A are perspective views illustrating a method of forming an integrated circuit device according to some embodiments of the present inventive concept.

Some example embodiments of the present inventive concept are described below with reference to the accompanying drawings. Many different forms and embodiments are possible without deviating from the spirit and teachings of this disclosure and so the disclosure should not be construed as limited to the example embodiments set forth herein. Rather, these embodiments are provided so that this disclosure will be thorough and complete and will fully convey the present inventive concept to those skilled in the art, and the present inventive concept will only be defined by the appended claims. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like reference numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the singular forms "a," "an," "the" and similar referents in the context of describing the present inventive concept are intended to include both the singular forms as well as the plural forms, unless the context clearly indicates otherwise. It will be further understood that the terms "comprising," "having," "including," and "containing", when used in this specification, specify the presence of stated features, steps, operations, elements and/or components, but do not preclude the presence or addition of one or more other features, steps, operations, elements, components and/or groups thereof.

It will be understood that, although the terms first, second, etc. may be used herein to describe various elements, these elements should not be limited by these terms. These terms are only used to distinguish one element from another element. Thus, for example, a first element, a first component or a first section could be termed a second element, a second component or a second section without departing from the teachings of the present inventive concept.

Some example embodiments of the present inventive concept are described with reference to cross-sectional views and/or plan views that are schematic illustrations of idealized embodiments and intermediate structures of some embodiments. As such, variations from the shapes of the illustrations as a result, for example, of manufacturing techniques and/or tolerances, are to be expected. Thus, theses example embodiments of the present inventive concept should not be construed as limited to the particular shapes illustrated herein but may include deviations in shapes that result, for example, from manufacturing.

Unless defined otherwise, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIGS. 1 through 6, 8, 9A, 12A and 13 are perspective views illustrating a method of forming an integrated circuit device according to some embodiments of the present inventive concept.

Referring to FIG. 1, a first mask pattern 201 may be formed on a substrate 100. Here, the first mask pattern 201 may be, for example, a mandrel, but not limited thereto. A second mask layer 205 may be formed on the substrate 100 including the first mask pattern 201.

The substrate 100 may be, for example, bulk silicon or a silicon-on-insulator (SOI). In some embodiments, the substrate 100 may be a silicon substrate, or a substrate including materials, for example, germanium, silicon germanium, indium antimonide, lead telluride compound, indium arsenide, indium phosphide, gallium arsenide and/or gallium antimonide.

In some embodiments, the substrate 100 may include an epitaxial layer formed on a base substrate. For example, an active fin 120 in FIG. 3 may be an epitaxial layer formed on a base substrate. The epitaxial layer may include, for example, a semiconductor element, such as silicon or germanium. In some embodiments, the epitaxial layer may include a compound semiconductor, for example, a group IV-IV compound semiconductor or a group III-V compound semiconductor. The group IV-IV compound semiconductor may be, for example, a binary compound or a ternary compound including at least two elements of carbon (C), silicon (Si), germanium (Ge), and tin (Sn) or a compound doped with a group IV element. The group III-V compound semiconductor may include, for example, a binary compound, a ternary compound or a quaternary compound including at least one group III element (e.g., aluminum (Al), gallium (Ga) and indium (In)) and at least one group V element (e.g., phosphorus (P), arsenic (As) and antimony (Sb)). In some embodiments, the substrate 100 may be a silicon substrate.

The second mask layer 205 may be conformally formed along an upper surface of the substrate 100 including the first mask pattern 201. The first mask pattern 201 and the second mask layer 205 may include materials having etching selectivity to each other. For example, the second mask layer 205 may include silicon oxide, silicon nitride, silicon oxynitride, photo resist, spin on glass (SOG) and/or spin on hard mask (SOH). The first mask pattern 201 may include silicon oxide, silicon nitride, silicon oxynitride, photo resist, spin on glass (SOG) and/or spin on hard mask (SOH) and may include a material different from the second mask layer 205.

The first mask pattern 201 and the second mask layer 205 may be formed by a physical vapor deposition process (PVD), a chemical vapor deposition process (CVD), an atomic layer deposition (ALD) and/or spin coating.

Figure 2:
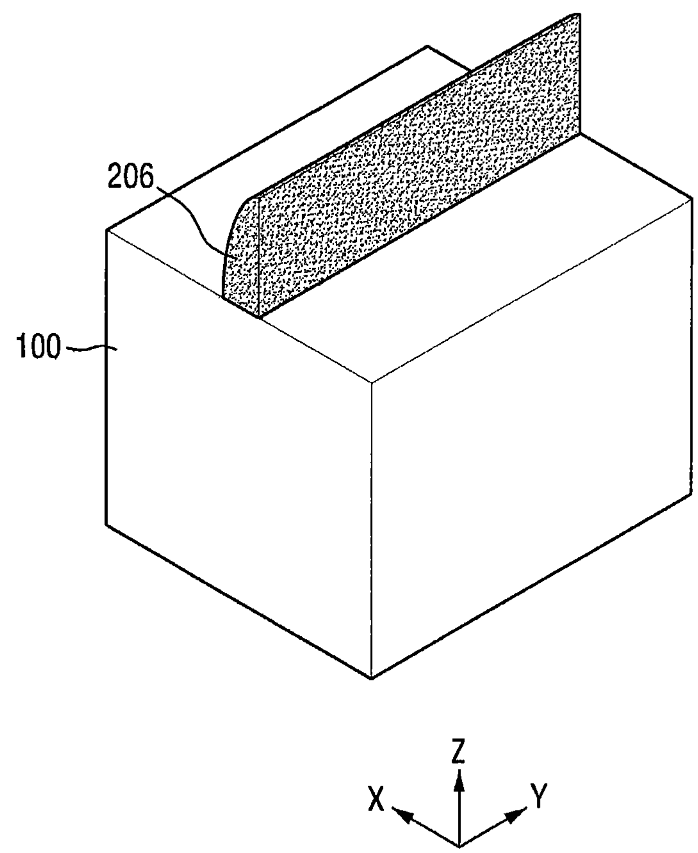

Referring to FIG. 2, a second mask pattern 206 may be formed from the second mask layer 205 using an etching process. The second mask pattern 206 may be formed on a side surface of the first mask pattern 201 and may expose an upper surface of the first mask pattern 201. The second mask pattern 206 may be formed as a spacer on the side surface of the first mask pattern 201. The first mask pattern 201 exposed by the second mask pattern 206 may be removed, thereby exposing the substrate 100 adjacent both sides of the second mask pattern 206. Although the second mask pattern 206 on one side surface of the first mask pattern 201 is illustrated in FIG. 2, the second mask pattern 206 may also be formed on both side surfaces of the first mask pattern 201 such that two second mask patterns 206 may be formed on the both sides of the first mask pattern 201.

The first mask pattern 201 may be removed using a selective etching process with respect to the second mask pattern 206 such that etching of the second mask pattern 206 may be reduced or possibly minimized when the first mask pattern 201 is removed.

Figure 3:
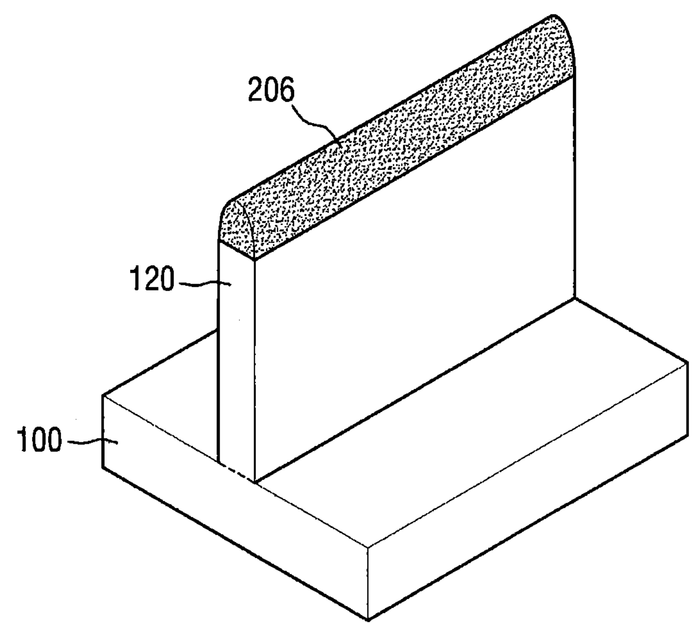

Referring to FIG. 3, the substrate 100 may be etched using the second mask pattern 206 as an etch mask to form the active fin 120 on the substrate 100. The active fin 120 may protrude from the substrate in a first direction X and may extend in a second direction Y. A recess may be formed around the active fin 120 formed by removing the portion of the substrate 100.

The active fin 120 may have a vertical side as illustrated in FIG. 3, but not limited thereto. In some embodiments, a side surface of the active fin 120 may not be vertical. For example, the active fin 120 may have a tapered cross-section.

Figure 4:
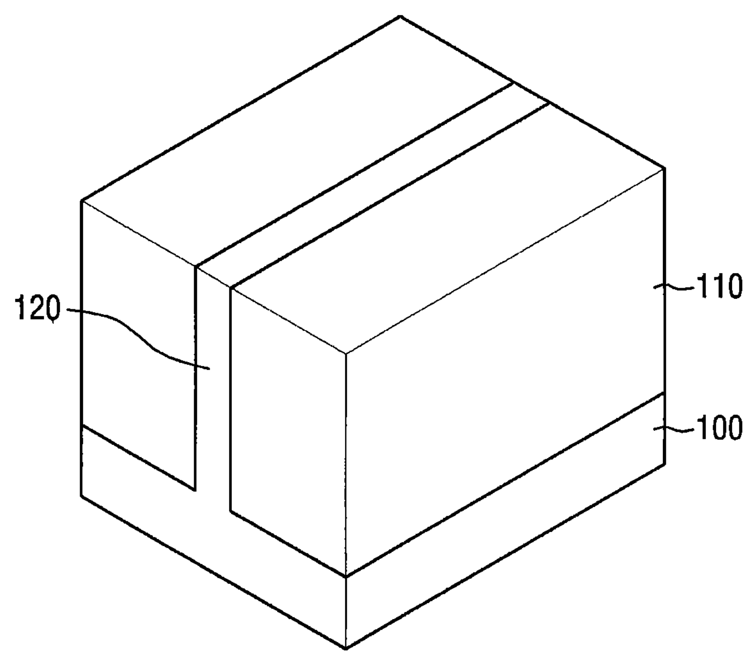
Figure 4:
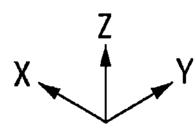

Referring to FIG. 4, a preliminary field insulation layer may be formed on the active fin 120 and the substrate 100. The preliminary field insulation layer may surround the active fin 120. The preliminary field insulation layer may be planarized to form a field insulation layer 110. In some embodiments, upper surfaces of the active fin 120 and the field insulation layer 110 may be substantially coplanar. For example, the field insulation layer 110 may include silicon oxide, silicon nitride and/or silicon oxynitride.

During the planarization process, the second mask pattern 206 may be removed, but not limited thereto. In some embodiments, the second mask pattern 206 may be removed before forming the field insulation layer 110 or after performing a recess process described in FIG. 5.

Figure 5:
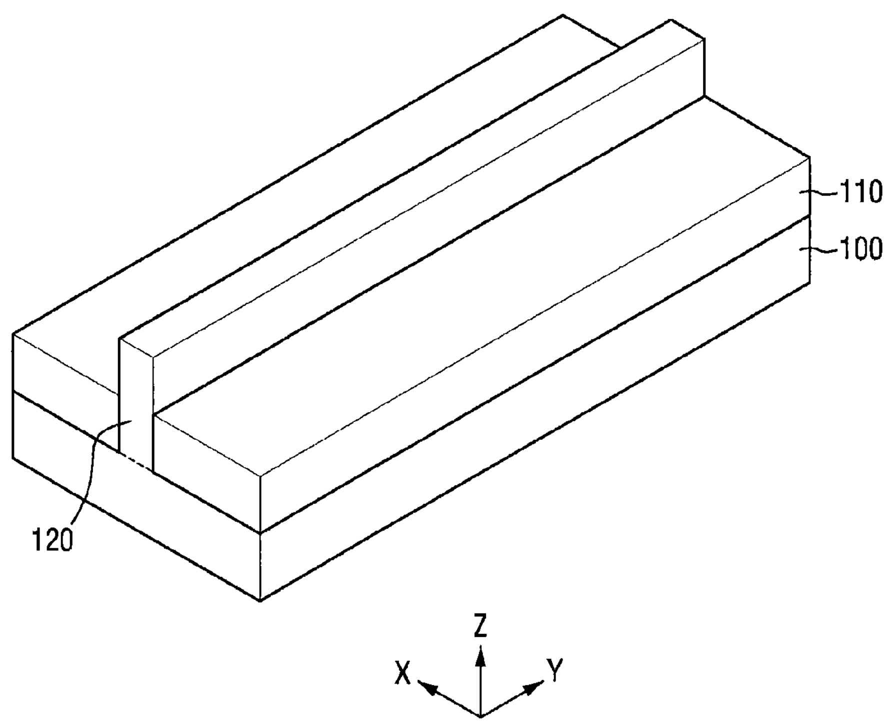

Referring to FIG. 5, an upper portion of the field insulation layer 110 may be recessed to expose an upper portion of the active fin 120. The upper portion of the active fin 120 protruding from the field insulation layer 110 may be formed. The upper portion of the field insulation layer 110 may be recessed using a selective etching process.

In some embodiments, the upper portion of the active fin 120 protruding from the field insulation layer 110 may be formed using an epitaxial growth process. After forming the field insulation layer 110, the upper portion of the active fin 120 may be formed using an epitaxial growth process using a top surface of the active fin 120 exposed by the field insulation layer 110 as a seed. A recess process recessing the upper portion of the field insulation layer 110 may be omitted when the active fin 120 is formed using an epitaxial growth process.

In some embodiments of the present inventive concept, a doping process for threshold voltage adjustment may be performed on the active fin 120. The active fin 120 may be in an NMOS transistor and an impurity, for example, boron (B), may be doped. The active fin 120 may be in a PMOS transistor and an impurity, for example, phosphorus (P) or arsenic (As), may be doped.

Figure 6:
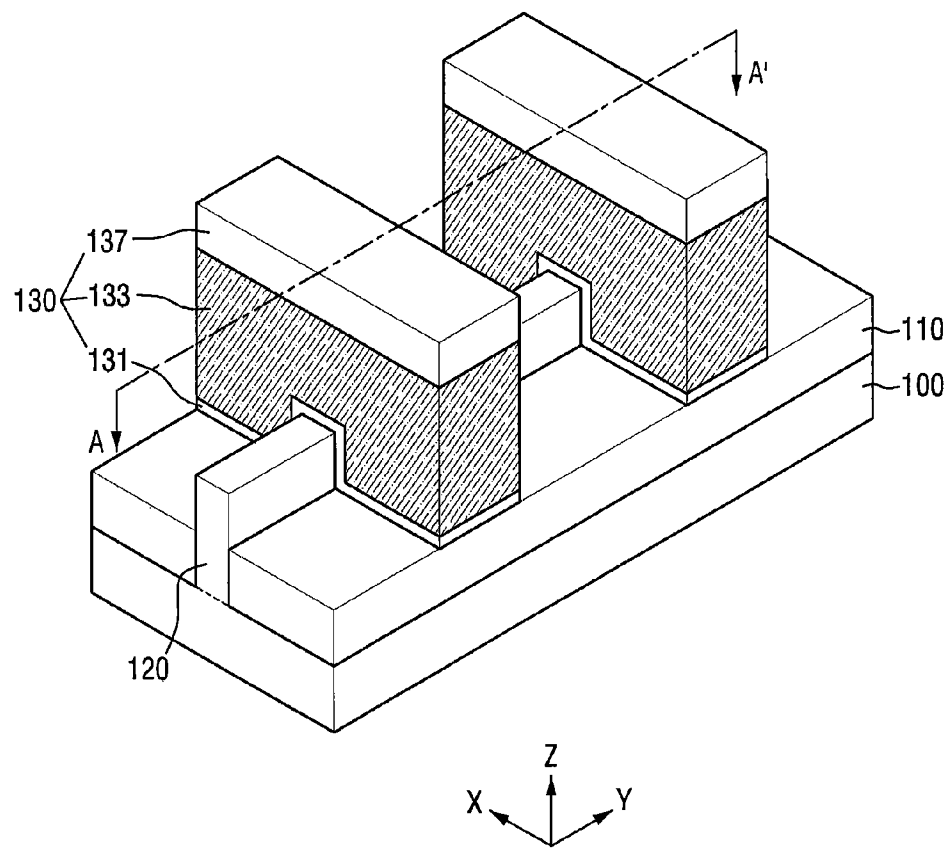

FIG. 6 is a perspective view illustrating a method of forming an integrated circuit device according to some embodiments of the present inventive concept. Referring to FIG. 6, a dummy gate structure 130 crossing the active fin 120 may be formed on the active fin 120. The dummy gate structure 130 may extend in the first direction X.

The dummy gate structure 130 may include a dummy silicon oxide layer 131, a polysilicon layer 133, and a hard mask 137 that are sequentially stacked. The dummy gate structure 130 may be a stacked structure including the dummy silicon oxide layer 131, the polysilicon layer 133, and the hard mask 137 and extending in the first direction X.

The dummy gate structure 130 may be formed using the hard mask 137 as an etch mask.

The dummy silicon oxide layer 131 may be formed on the active fin 120 and on the field insulation layer 110 as illustrated in FIG. 6, but not limited thereto. In some embodiments, the dummy silicon oxide layer 131 may be formed only on the active fin 120 protruding from the field insulation layer 110.

The dummy silicon oxide layer 131 may not be formed on a portion of the active fin 120, which is not overlapped with the poly silicon layer 133, but aspects of the present inventive concept are not limited thereto. In some embodiments, the dummy silicon oxide layer 131 may be formed on an entirely surface of the active fin 120 exposed by the field insulation layer 110.

The dummy silicon oxide layer 131 may protect the active fin 120 that may be used as a channel region.

Figure 7:
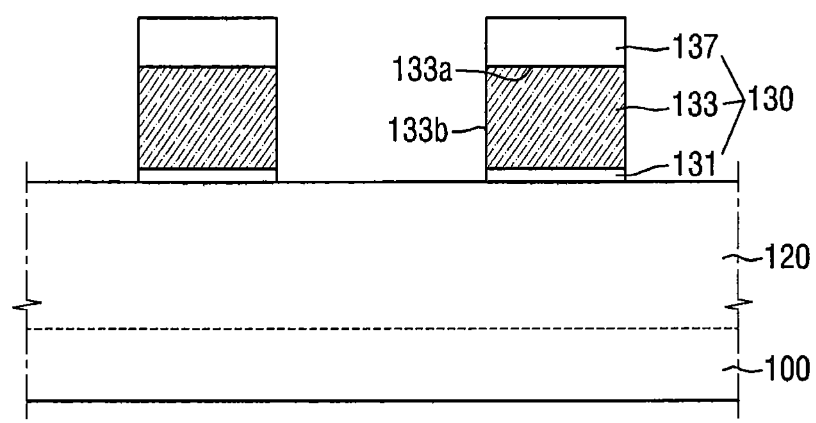
FIG. 7 is a cross-sectional view taken along the line A-A' of FIG. 6.

FIG. 7 is a cross-sectional view taken along the line A-A' of FIG. 6. Referring to FIG. 7, the polysilicon layer 133 may be formed on the dummy silicon oxide layer 131. The polysilicon layer 133 may include a side surface 133*b*, a top surface 133*a* and a corner therebetween. The top surface 133*a* of the polysilicon layer 133 may be substantially parallel to the top surface of the field insulation layer 110, and the side surface 133*b* of the polysilicon layer 133 may be substantially perpendicular to an upper surface of the substrate 100.

The polysilicon layer 133 may overlie the dummy silicon oxide layer 131 and may cover the active fin 120 protruding from the field insulation layer 110. A distance between an upper surface of the field insulation layer 110 and the top surface of the active fin 120 may be smaller than a distance between the upper surface of the field insulation layer 110 and the top surface 133*a* of the polysilicon layer 133.

The polysilicon layer 133 may have a high etch selectivity with respect to the dummy silicon oxide layer 131. Therefore, when the polysilicon layer 133 is removed to form a trench during a replacement metal gate process, the underlying dummy silicon oxide layer 131 may not be etched. Accordingly, the active fin 120 disposed under the dummy silicon oxide layer 131 may be protected when the polysilicon layer 133 is removed.

The hard mask 137 may be formed on the polysilicon layer 133. The hard mask 137 may include, for example, silicon nitride (SiN), but not limited thereto. The hard mask 137 may include a material having higher resistance to etching than a gate spacer layer (e.g., 151*p* of FIG. 8.)

Figure 8:
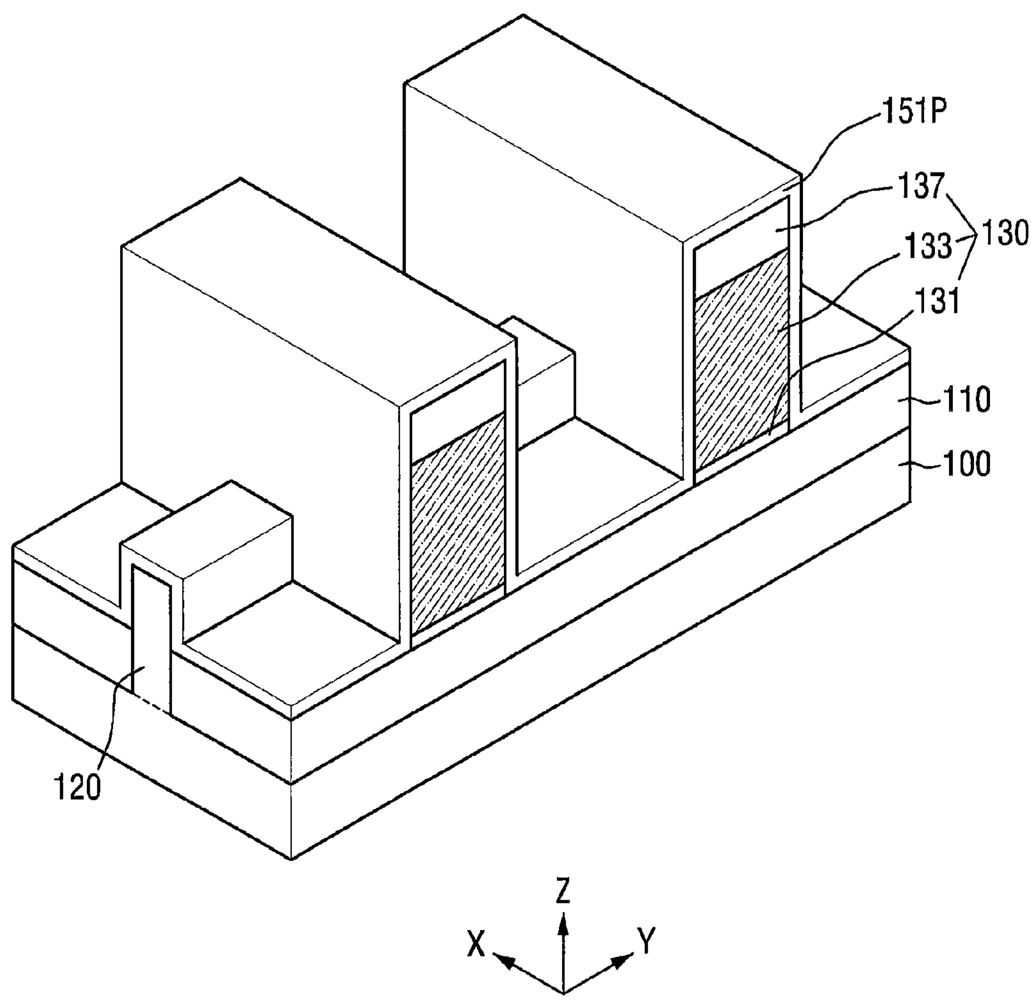

Referring to FIG. 8, a gate spacer layer 151*p* may be formed on the active fin 120 and the dummy gate structure 130. The gate spacer layer 151*p* may cover the active fin 120 and the dummy gate structure 130.

The gate spacer layer 151*p* may be conformally formed on side surfaces and a top surface of the dummy gate structure 130, side surfaces and a top surface of the active fin 120 and the upper surface of the field insulation layer 110.

For example, the gate spacer layer 151*p* may include a low-k material, such as SiOCN, but not limited thereto. The gate spacer layer 151*p* may be formed using chemical vapor deposition process (CVD) and/or atomic layer deposition (ALD).

In some embodiments, the hard mask 137 may include silicon nitride (SiN) and the gate spacer layer 151*p* may include SiOCN. The hard mask 137 may include a material having higher resistance to etching than the gate spacer layer 151*p*. Therefore, as shown in FIGS. 9A and 9B, the hard mask 137 and the gate spacer layer 151*p* may be etched concurrently and the gate spacer 151 may thus be formed on the side surfaces of the dummy gate structure 130 and may expose the hard mask 137.

Figure 9A:
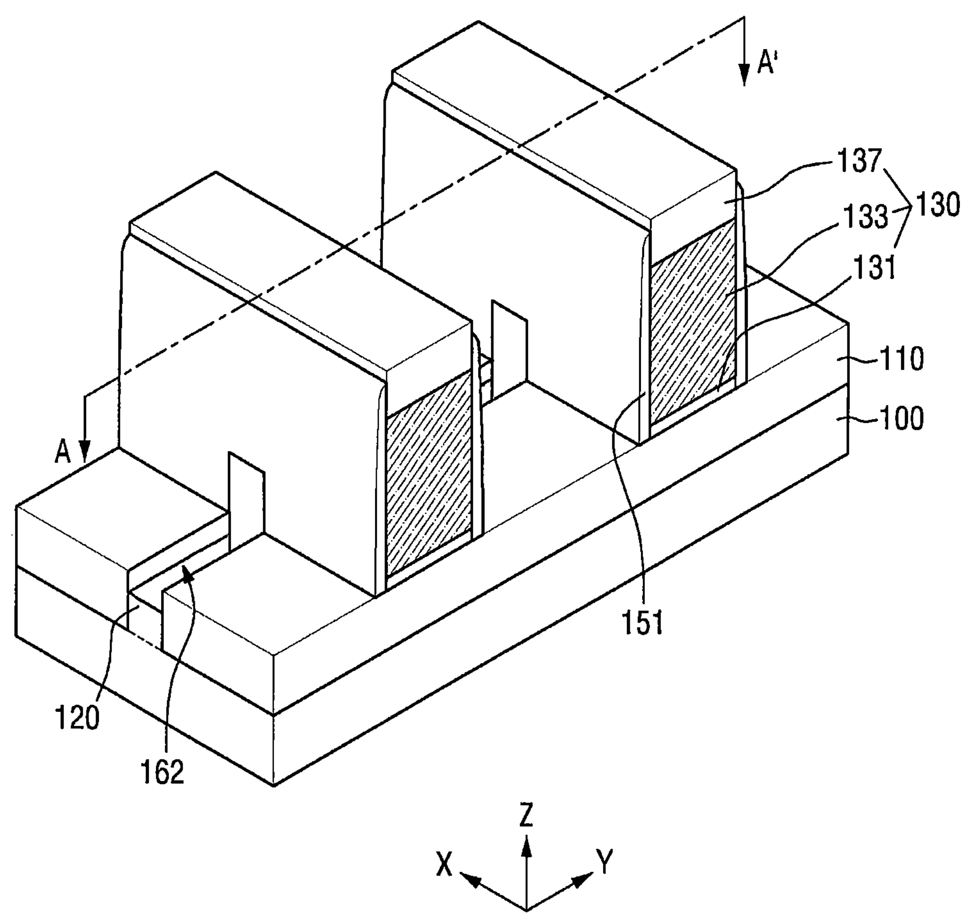
Figure 9B:
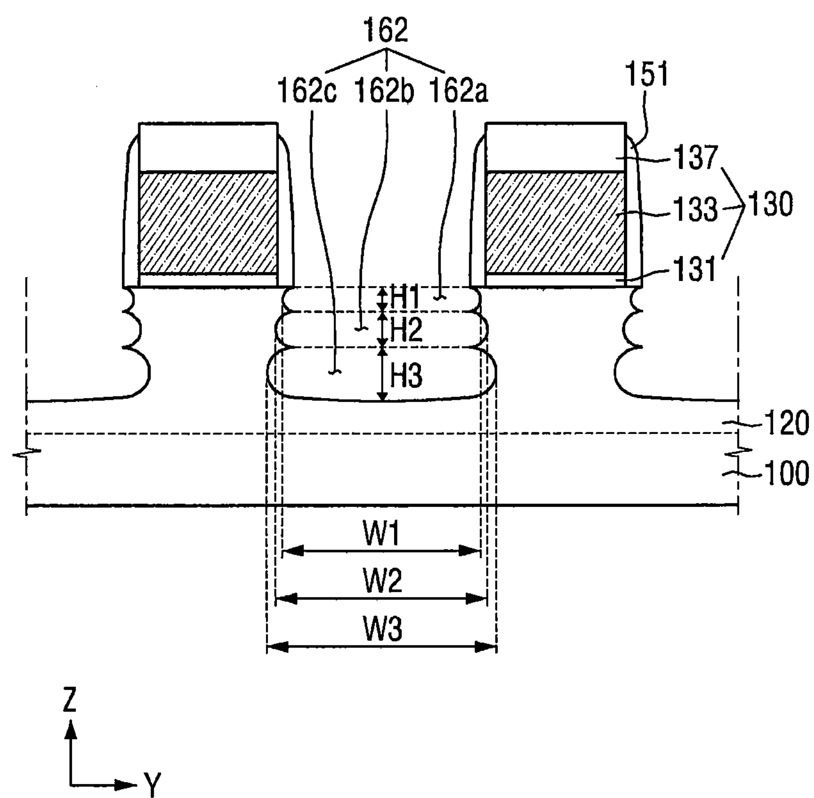
FIGS. 9B, 10B, 10C, 10D and 10E are cross-sectional views taken along the line A-A' of FIG. 9A.

FIG. 9A is a perspective view illustrating a method of forming an integrated circuit device according to some embodiments of the present inventive concept and FIG. 9B is a cross-sectional views taken along the line A-A' of FIG. 9A. Referring to FIGS. 9A and 9B, a trench 162 may be formed adjacent the side surfaces of the dummy gate structure 130. The trench 162 may be formed in the active fin 120 adjacent the side surfaces of the gate spacer 151.

The gate spacer 151 on the side surfaces of the dummy gate structure 130 and the trench 162 in the active fin 120 may be formed concurrently. Stated in other words, when the trench 162 is formed, the gate spacer 151 may also be formed.

Since the gate spacer 151 is formed by etching the gate spacer layer 151*p* shown in FIG. 8, the gate spacer 151 may include a different material from the hard mask 137. In some embodiments, the hard mask 137 may include a material having higher resistance to etching than the gate spacer 151.

As illustrated in FIGS. 9A and 9B, a distance between the top surface of the field insulation layer 110 to an uppermost portion of the gate spacer 151 may be smaller than a distance between the top surface of the field insulation layer 110 and the top surface of the dummy gate structure 130, the top surface of the hard mask 137. The top surface of the hard mask 137 may be disposed higher than the uppermost portion of the gate spacer 151.

When the gate spacer 151 is formed on the side surfaces of the dummy gate structure 130, a fin spacer may be formed on the side surfaces of the active fin 120 that is not overlapped with the dummy gate structure 130. The fin spacer formed on the side surfaces of the active fin 120 may be removed to form the trench 162 in the active fin 120. When the fin spacer formed on the side surfaces of the active fin 120 is removed, the height of the gate spacer 151 may be reduced and an upper portion of the hard mask 137 may be removed.

In some embodiments, the hard mask 137 may include a material having higher resistance to etching than the gate spacer 151, a thickness of the hard mask 137 that is removed may thus be smaller than a thickness of the gate spacer 151 that is removed. Accordingly, a height of the gate spacer 151 with respect to an upper surface of the field insulation layer 110 may be smaller than a height of the dummy gate structure 130 with respect to the upper surface of the field insulation layer 110.

Referring to FIG. 9B, the trench 162 may include a first sub trench 162*a*, second sub trench 162*b* and third sub trench 162*c*. It will be understood that the term "sub trench" may refer to a portion of a trench.

The first sub trench 162*a*, the second sub trench 162*b* and the third sub trench 162*c* may be disposed to be adjacent one another in a third direction Z. Stated in other words, the first sub trench 162*a*, the second sub trench 162*b* and the third sub trench 162*c* may be disposed along the third direction Z. The second sub trench 162*b* may be disposed under the first sub trench 162*a* and the third sub trench 162*c* may be disposed under the second sub trench 162*b* such that the second sub trench 162*b* may be disposed between the first sub trench 162*a* and the third sub trench 162*c*.

In some embodiments, the first sub trench 162*a*, the second sub trench 162*b* and the third sub trench 162*c* may have respective maximum widths and depths that increase along the third direction Z. A maximum width W1 of the first sub trench 162*a* in the second direction Y may be smaller than a maximum width W2 of the second sub trench 162*b* in the second direction Y. The maximum width W2 of the second sub trench 162*b* in the second direction Y may be smaller than a maximum width W3 of the third sub trench 162*c* in the second direction Y.

A maximum depth H1 of the first sub trench 162*a* in the third direction Z may be smaller than a maximum depth H2 of the second sub trench 162*b* in the third direction Z. The maximum depth H2 of the second sub trench 162*b* in the third direction Z may be smaller than a maximum depth H3 of the third sub trench 162*c* in the third direction Z. In some embodiments, a cross-section of the trench 162 may be similar to A-shaped as illustrated in FIG. 9B. It will be understood that the term "depth" may refer to a distance between an uppermost portion of the sub trench and a lowermost portion of the sub trench in the third direction Z (e.g., H1, H2 and H3 of FIG. 9B).

A method for forming the trench 162 will be described with reference to FIGS. 10A to 10E. For brevity, changes in shape of the gate spacer 151 are not illustrated in FIGS. 10B to 10E.

Figure 10A:
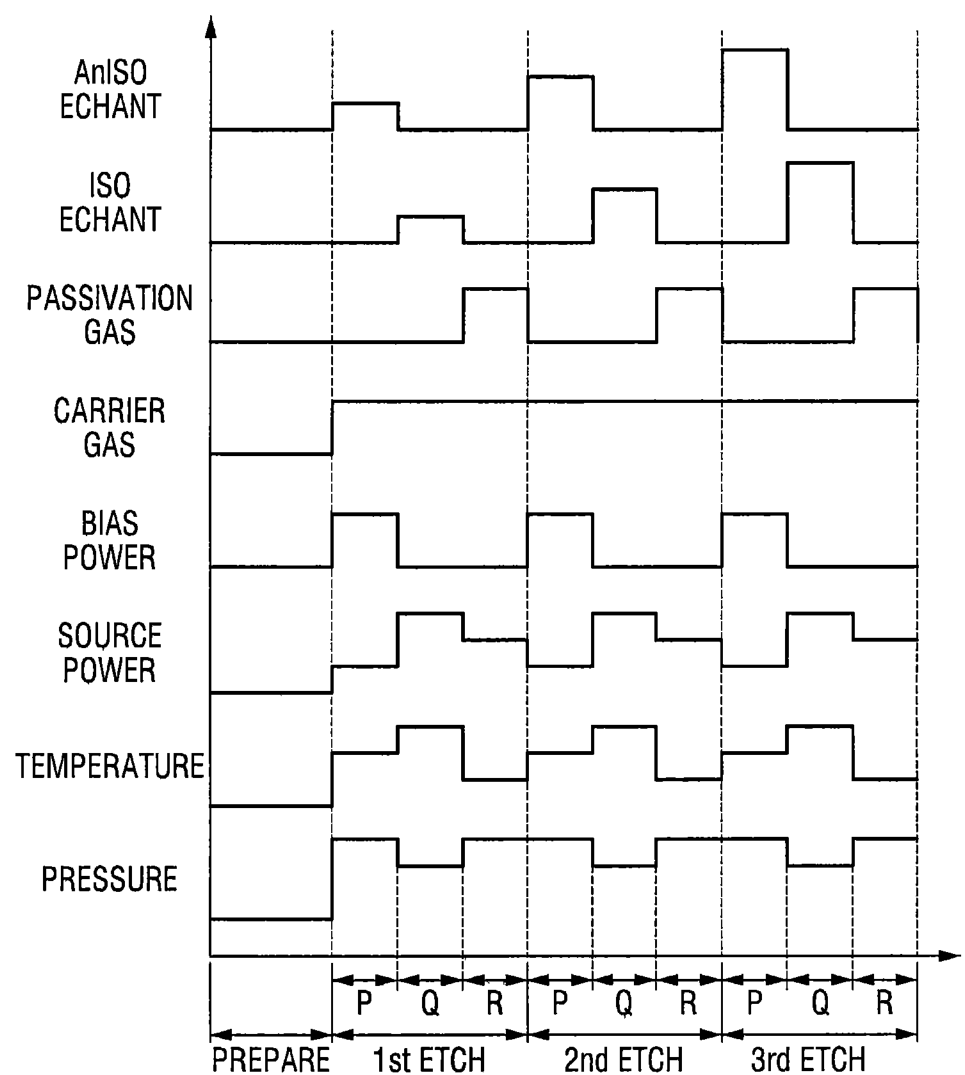
FIGS. 10A and 11 are diagrams illustrating a method of forming an integrated circuit device according to some embodiments of the present inventive concept.

In some embodiments, the trench 162 may be formed using an in-situ process, which may be performed in a single chamber. The in-situ process may be performed in the single chamber as described in FIG. 10A. FIG. 10A is a diagram illustrating a method of forming an integrated circuit device according to some embodiments of the present inventive concept. FIGS. 10B, 10C, 10D and 10E are cross-sectional views, which is taken along the line A-A' of FIG. 9A.

Figure 10B:
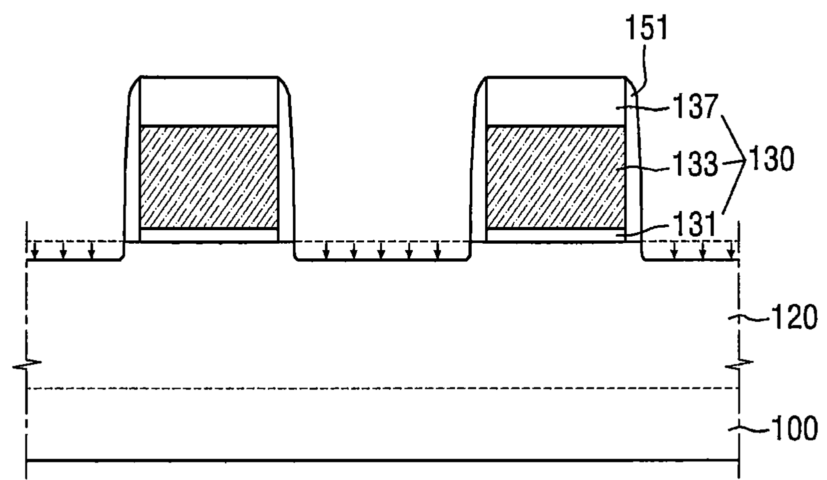

Referring to FIG. 10A, the active fin 120 may be etched using a first etchant of a first concentration with a bias voltage during a period P of a first etching process (i.e., 1st ETCH of FIG. 10A) such that the active fin 120 may be anisotropically etched as shown in FIG. 10B. Accordingly, the first etchant may be referred to as an anisotropic etchant, AnISO ECHANT. In some embodiments, a flow rate of an anisotropic etchant may change as illustrated in FIG. 10A.

Figure 10C:
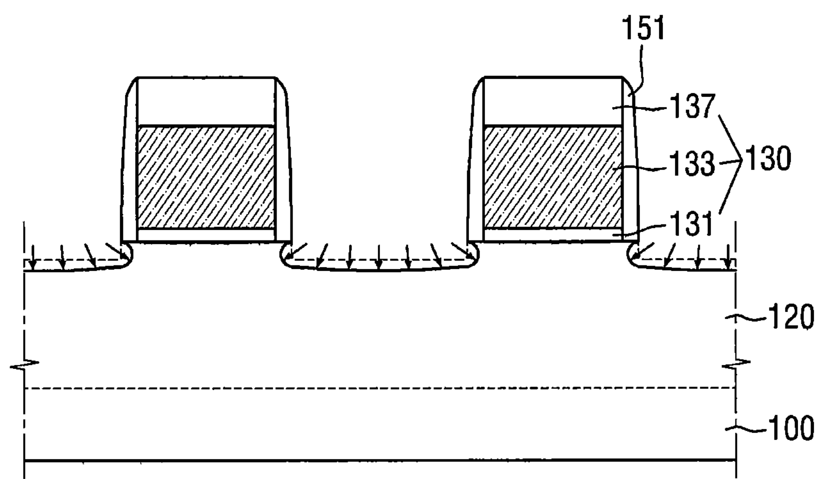

The active fin 120 may be etched using a second etchant of a second concentration without a bias voltage during a period Q of the first etching process such that the active fin 120 may be isotropically etched as shown in FIG. 10C. Accordingly, the second etchant may be referred to as an isotropic etchant, ISO ETCHANT. In some embodiments, a flow rate of the isotropic etchant may change as illustrated in FIG. 10A.

Figure 10D:
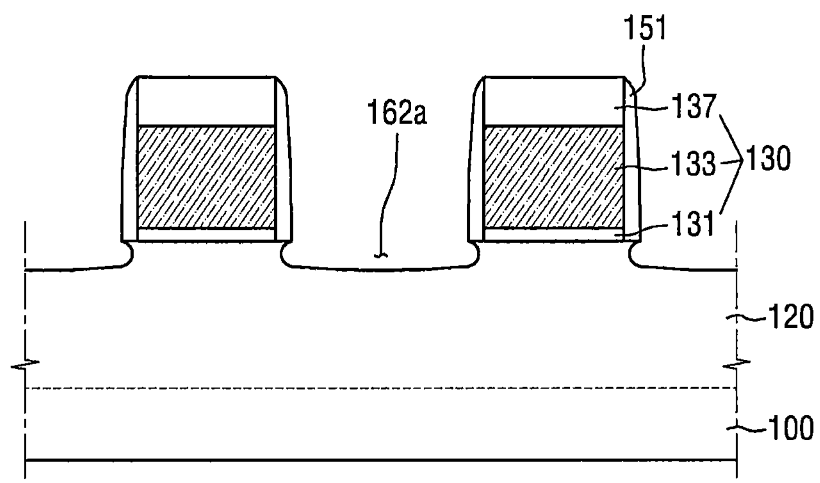

The etched active fin 120 may be passivated using a passivation gas during a period R of the first etching process. Accordingly, the first sub trench 162*a* may be formed as shown in FIG. 10D. In some embodiments, a flow rate of the passivation gas may change as illustrated in FIG. 10A.

In some embodiments, the first and second etchants may be substantially the same. For example, the first and second etchants may include $CF_4$, $NF_4$ or $SF_6$ and the passivation gas may include $O_2$, $N_2$, or $C4F_8$. However, the first and second etchants and the passivation gas are not limited thereto.

Figure 10E:
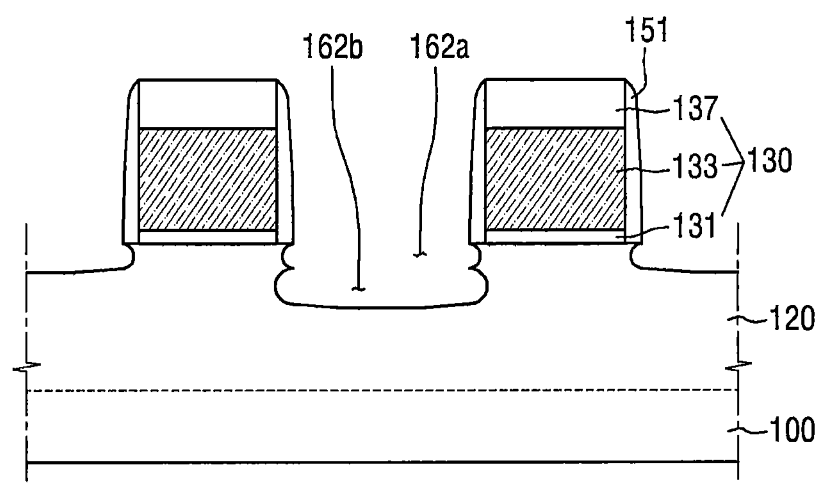

Referring again to FIG. 10A, the active fin 120 may be etched using a third etchant of a third concentration with a bias voltage during a period P of a second etching process (i.e., 2nd ETCH of FIG. 10A). The active fin 120 may be etched using a fourth etchant of a fourth concentration without a bias voltage during a period Q of the second etching process. The etched active fin 120 may be passivated using a passivation gas during a period R of the second etching process. After performing the second etching process, the second sub trench 162*b* may be formed under the first sub trench 162*a* as shown in FIG. 10E. It will be understood that the third etchant may be referred to as an anisotropic etchant and the fourth etchant may be referred to as an isotropic etchant.

In some embodiments, the third concentration may be higher than the first concentration and the fourth concentration may be higher than the second concentration. Accordingly, the second sub trench 162*b* may be larger than the first sub trench 162*a* in size. For example, FIG. 10E shows the second sub trench 162*b* that is larger than the first sub trench 162*a* in size.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 10A, the active fin 120 may be etched using a fifth etchant of a fifth concentration with a bias voltage during a period P of a third etching process (i.e., 3rd ETCH of FIG. 10A). The active fin 120 may be etched using a sixth etchant of a sixth concentration without a bias voltage during a period Q of the third etching process. The etched active fin 120 may be passivated using a passivation gas during a period R of the third etching process. After performing the third etching process, the third sub trench 162*c* may be formed under the second sub trench 162*b*, as shown in FIG. 9B. It will be understood that the fifth etchant may be referred to as an anisotropic etchant and the sixth etchant may be referred to as an isotropic etchant.

In some embodiments, the fifth concentration may be higher than the third concentration and the sixth concentration may be higher than the fourth concentration. The third sub trench 162*c* may thus be larger than the second sub trench 162*b* in size.

In some embodiments, the fifth etchant and the sixth etchant may be substantially the same. In some embodiments, the fifth etchant and the first etchant may be substantially the same and the sixth etchant and the second etchant may be substantially the same. However, of the fifth etchant and the sixth etchant are not limited thereto.

The first etchant of the first etching process, the third etchant of the second etching process and the fifth etchant of the third etching process may include substantially the same chemical components but may have different concentrations. The second etchant of the first etching process, the fourth etchant of the second etching process and the sixth etchant of the third etching process may include substantially the same chemical components but may have different concentrations. Therefore, the first sub trench 162*a*, the second sub trench 162*b* and the third sub trench 162*c* may have different sizes.

In some embodiments, a carrier gas may be provided during the first, second and third etching processes and a flow rate of the carrier gas may change as illustrated in FIG. 10A. Further, a source power may be applied during the first, second and third etching processes and may change as illustrated in FIG. 10A. A temperature and a pressure of the first, second and third etching processes may change as illustrated in FIG. 10A. In some embodiments, a method may also include a preparation period (e.g., PREPARE in FIG. 10A) before the first etching process.

It will be understood that the trench 162 shown in FIG. 9B may be formed using various methods. In some embodiments, the trench 162 may be formed using a method illustrated in FIG. 11.

Figure 11:
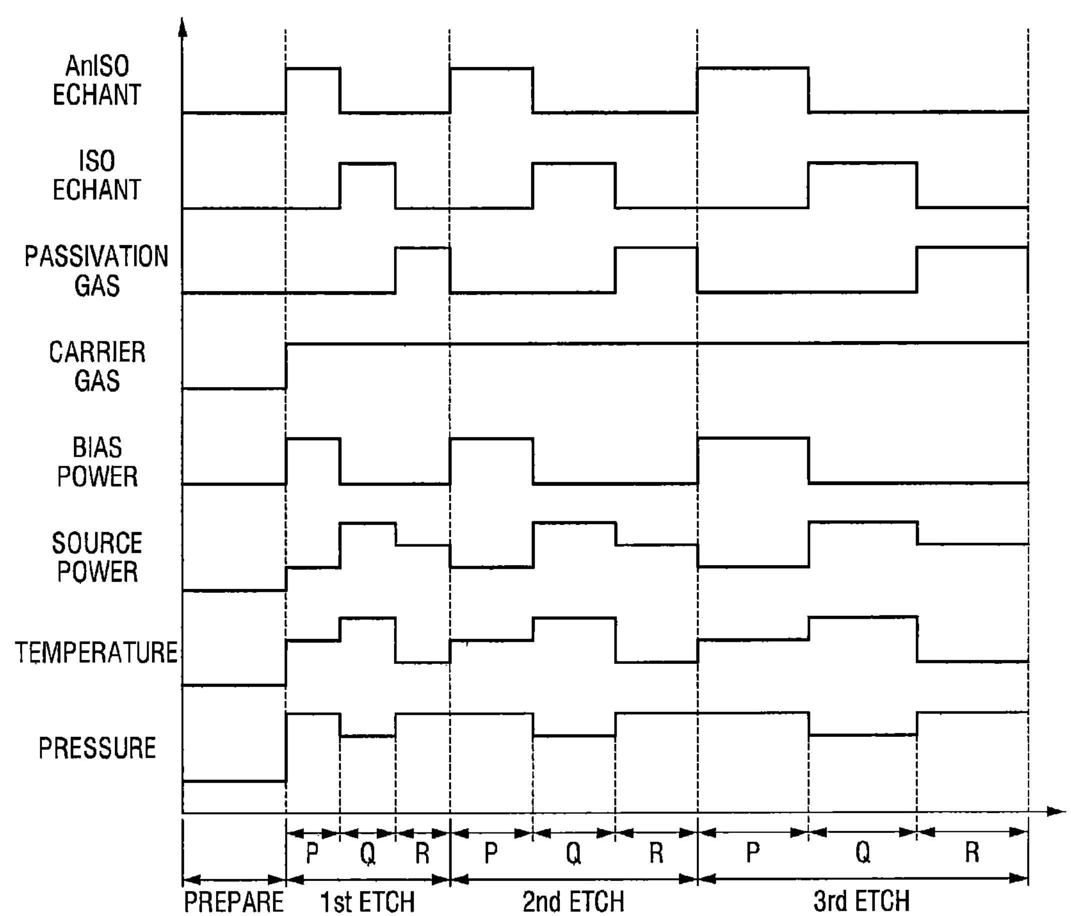

FIG. 11 is a diagram illustrating a method of forming an integrated circuit device according to some embodiments of the present inventive concept. Referring to FIG. 11, the active fin 120 may be etched using a first etchant with a bias voltage during a period P of a first etching process. Accordingly, the active fin 120 may be anisotropically etched because of the bias voltage, as shown in FIG. 10B.

The active fin 120 may be etched using a second etchant without a bias voltage during a period Q of the first etching process. Accordingly, the active fin 120 may be isotropically etched, as shown in FIG. 10C.

The etched active fin 120 may be passivated using a passivation gas during a period R of the first etching process. Accordingly, the first sub trench 162*a* may be formed, as shown in FIG. 10D.

In some embodiments, the first and second etchants may be substantially the same. For example, the first and second etchants may include $CF_4$, $NF_4$, or $SF_6$ and the passivation gas may include $O_2$, $N_2$, or $C_4F_8$. However, the first and second etchants and the passivation gas are not limited thereto.

Referring again to FIG. 11, the active fin 120 may be etched using a third etchant with a bias voltage during a period P of a second etching process. The active fin 120 may be etched using a fourth etchant without a bias voltage during a period Q of the second etching process. The etched active fin 120 may be passivated using a passivation gas during a period R of the second etching process. After performing the second etching process, the second sub trench 162*b* may be formed under the first sub trench 162*a*, as shown in FIG. 10E.

In some embodiments, the period P of the second etching process may be longer than the period P of the first etching process and the period Q of the second etching process may be longer than the period Q of the first etching process. Therefore, the second sub trench 162*b* may be larger than the first sub trench 162*a* in size.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 11, the active fin 120 may be etched using a fifth etchant with a bias voltage during a period P of a third etching process. The active fin 120 may be etched using a sixth etchant without a bias voltage during a period Q of the third etching process. The etched active fin 120 may be passivated using a passivation gas during a period R of the third etching process. After performing the third etching process, the third sub trench 162*c* may be formed under the second sub trench 162*b*, as shown in FIG. 9B.

In some embodiments, the period P of the third etching process may be longer than the period P of the second etching process and the period Q of the third etching process may be longer than the period Q of the second etching process. Therefore, the third sub trench 162*c* may be larger than the second sub trench 162*b* in size.

In some embodiments, the fifth etchant and the sixth etchant may be substantially the same. In some embodiments, the fifth etchant and the first etchant may be substantially the same and the sixth etchant and the second etchant may be substantially the same. However, the fifth etchant and the sixth etchant are not limited thereto.

The first etchant of the first etching process, the third etchant of the second etching process and the fifth etchant of the third etching process may include substantially the same chemical components and may have substantially the same concentration. The second etchant of the first etching process, the fourth etchant of the second etching process and the sixth etchant of the third etching process may include substantially the same chemical components and may have substantially the same concentration. However, the period P of the first etching process, the period P of the second etching process and the period P of the third etching process may be different, the period Q of the first etching process, the period Q of the second etching process and the period Q of the third etching process may be different and the period R of the first etching process, the period R of the second etching process and the period R of the third etching process may be different. Therefore, the first sub trench 162*a*, the second sub trench 162*b* and the third sub trench 162*c* may have different sizes.

Figure 12A:
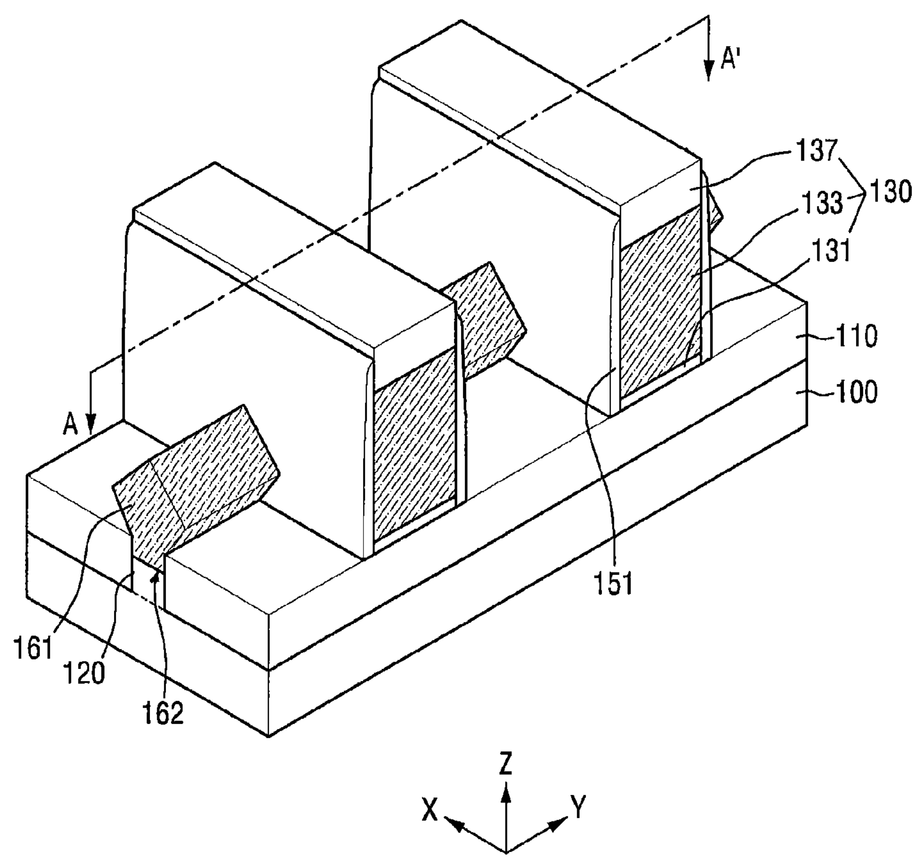
Figure 12B:
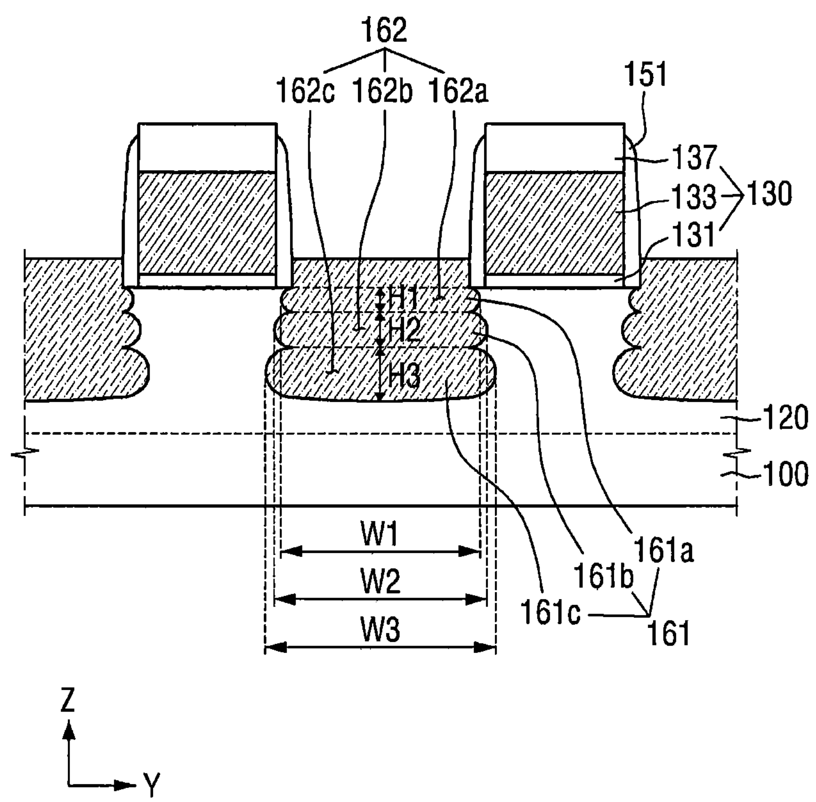
FIG. 12B is a cross-sectional view taken along the line A-A' of FIG. 12A.

FIG. 12A is a perspective view illustrating a method of forming an integrated circuit device according to some embodiments of the present inventive concept and FIG. 12B is a cross-sectional view taken along the line A-A' of FIG. 12A. Referring to FIGS. 12A and 12B, a semiconductor pattern 161 may be formed in the trench 162. In some embodiments, an epitaxial growth process may be used to form the semiconductor pattern 161. The semiconductor pattern 161 in the trench 162 may be adjacent a side surface of the dummy gate structure 130. The semiconductor pattern 161 may be a source/drain region of a transistor. In some embodiments, the semiconductor pattern 161 may be, for example, an elevated source/drain.

When the transistor including the active fin 120 is a PMOS transistor, the semiconductor pattern 161 may include a compressive stress material. For example, the compressive stress material may be a material having a greater lattice constant than that of silicon, such as SiGe. The compressive stress material may apply a compressive stress to the active fin 120, thereby improving mobility of carriers in a channel region.

When the transistor including the active fin 120 is an NMOS transistor, the semiconductor pattern 161 may include a material substantially the same as the substrate 100, or a tensile stress material. For example, when the substrate 100 includes silicon, the semiconductor pattern 161 may be Si or a material having a smaller lattice constant than silicon such as SiC.

In some embodiments, impurity may be doped into the semiconductor pattern 161 when the semiconductor pattern 161 is formed using an in-situ doping process. For example, impurity may be doped into the semiconductor pattern 161 when the semiconductor pattern 161 is grown using an epitaxial growth process.

The semiconductor pattern 161 may have a diamond shape, a circle or a rectangle. Although FIG. 12A shows the semiconductor pattern 161 having a diamond shape (i.e., a pentagon or a hexagon), but the semiconductor pattern 161 is not limited thereto.

Referring to FIG. 12B, the semiconductor pattern 161 may include a first segment 161*a*, a second segment 161*b* and a third segment 161*c* disposed in the first sub trench 162*a*, the second sub trench 162*b* and the third sub trench 162*c*, respectively. Each of the first segment 161*a*, the second segment 161*b* and the third segment 161*c* may have a curved sidewall and the curved sidewall may be convex. Each of the first segment 161*a*, the second segment 161*b* and the third segment 161*c* may have a width that varies non-monotonically along the third direction Z.

The first segment 161*a*, the second segment 161*b* and the third segment 161*c* may have respective maximum widths and thicknesses that increase along the third direction Z. For example, a maximum width W1 of the first segment 161*a* in the second direction Y may be smaller than a maximum width W2 of the second segment 161*b* in the second direction Y. The maximum width W2 of the second segment 161*b* may be smaller than a maximum width W3 of the third segment 161*c* in the second direction Y.

A maximum thickness H1 of the first segment 161*a* in the third direction Z may be smaller than a maximum thickness H2 of the second segment 161*b* in the third direction Z. The maximum thickness 112 of the second segment 161*b* in the third direction Z may be smaller than a maximum thickness H3 of the third segment 161*c* in the third direction Z.

Figure 13:
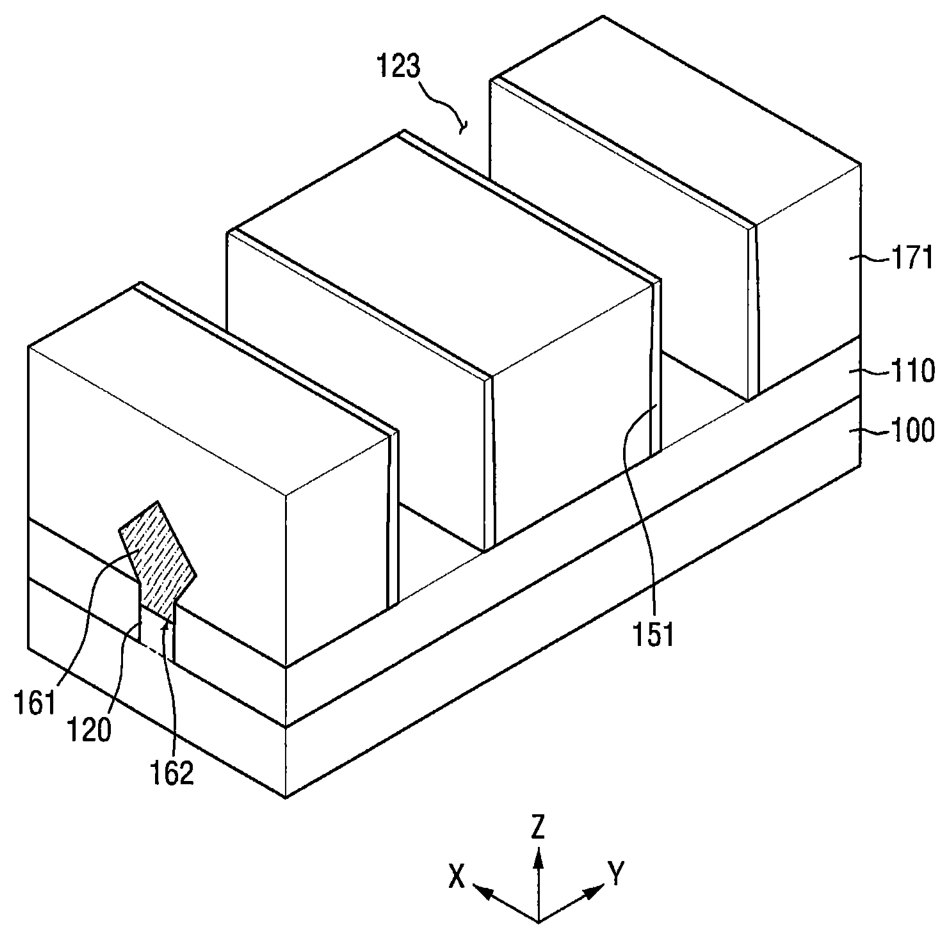

FIG. 13 is a perspective view illustrating a method of forming an integrated circuit device according to some embodiments of the present inventive concept. Referring to FIG. 13, a preliminary interlayer dielectric layer may be formed on the field insulation layer 110*a* to form an interlayer dielectric layer 171. The preliminary interlayer dielectric layer may cover the semiconductor pattern 161 and the dummy gate structure 130. The preliminary interlayer dielectric layer may be planarized until a top surface of the hard mask 137 is exposed such that the interlayer insulation layer 171 may be formed. In some embodiments, the preliminary interlayer insulation layer may be planarized until a top surface of the polysilicon layer 133 is exposed. The hard mask 137 may be removed when the interlayer insulation layer 171 is formed or after the interlayer insulation layer 171 is formed.

The interlayer dielectric layer 171 may include, for example, a low-k material, oxide, nitride and/or oxynitride. The low-k material may include, for example, flowable oxide (FOX), tonen silazene (TOXZ), undoped silicate glass (USG), borosilicate glass (BSG), phosphosilicate glass (PSG), borophosphosilicate glass (BPSG), plasma-enhanced tetraethylorthosilicate (PE-TEOS), fluorosilicate glass (FSG), high density plasma (HDP) oxide, plasma enhanced oxide (PEOX), flowable CVD (FCVD) and combinations thereof, but not limited thereto.

The polysilicon layer 133 and the dummy silicon oxide layer 131 may be removed, thereby forming a trench 123 crossing the active fin 120. The dummy gate structure 130 may be removed, thereby forming the trench 123 crossing the active fin 120 on the active fin 120.

Figure 14A:
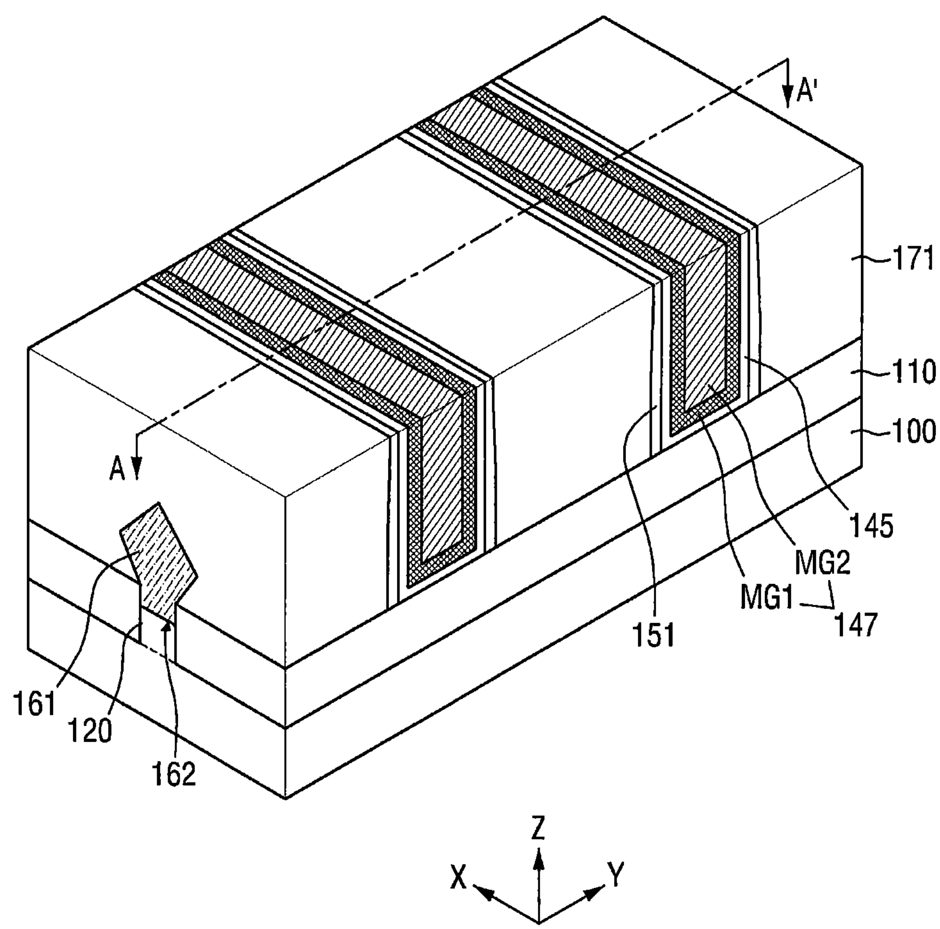
Figure 14B:
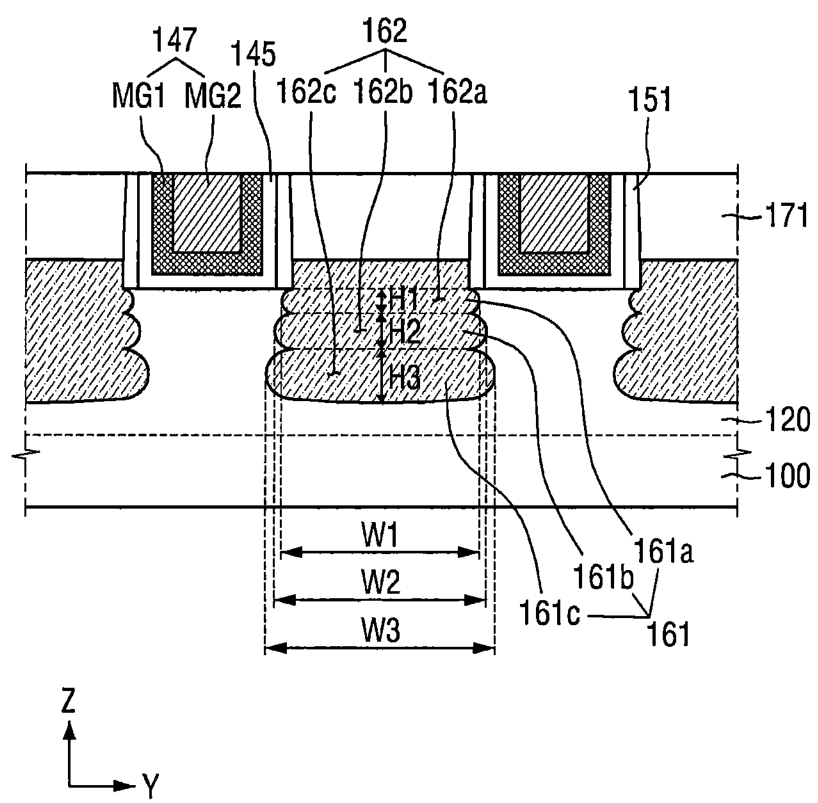
FIG. 14B is a cross-sectional view taken along the line A-A' of FIG. 14A.

FIG. 14A is a perspective view of an integrated circuit device according to some embodiments of the present inventive concept and FIG. 14B is a cross-sectional view taken along the line A-A of FIG. 14A. Referring to FIGS. 14A and 14B, a gate insulation layer 145 and a replacement gate electrode 147 may be formed in the trench 123.

The gate insulation layer 145 may be conformally formed along sidewalls and a bottom surface of the trench 123. For example, the gate insulation layer 145 may include a high-k dielectric film that has a dielectric constant higher than that of silicon dioxide. The gate insulation layer 145 may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. The gate insulation layer 145 are not limited thereto.

In some embodiments, the gate insulation layer 145 may extend between a side of the spacer 151 and a side surface of the replacement gate electrode 147 and may extend in the third direction Z as illustrated in FIG. 14A.

The replacement gate electrode 147 may include metal layers MG1 and MG2. As shown, the replacement gate electrode 147 may include two metal layers MG1 and MG2 stacked. In some embodiments, the replacement gate electrode 147 may include more than two metal layers. The first metal layer MG1 may adjust a work function. The second metal layer MG2 may fill a space defined by the first metal layer MG1. For example, the first metal layer MG1 may include at least one of TiN, TaN, TiC, and TaC. In addition, the second metal layer MG2 may include tungsten W or aluminum Al.

Referring to FIG. 14B, a semiconductor pattern 161 may be formed in the trench 162 and may be a source/drain of a transistor. The trench 162 may include a first sub trench 162*a*, a second sub trench 162*b* and a third sub trench 162*c*.

The first sub trench 162*a*, the second sub trench 162*b* and the third sub trench 162*c* may be disposed in a third direction Z. The second sub trench 162*b* may be disposed under the first sub trench 162*a* and the third sub trench 162*c* may be disposed under the second sub trench 162*b* such that the second sub trench 162*b* may be disposed between the first sub trench 162*a* and the third sub trench 162*c*.

In some embodiments, the first sub trench 162*a*, the second sub trench 162*b* and the third sub trench 162*c* may have respective maximum widths and depths that may increase monotonically from the first sub trench 162*a* to the third sub trench 162*c*. A maximum width W1 of the first sub trench 162*a* in the second direction Y may be smaller than a maximum width W2 of the second sub trench 162*b* in the second direction Y. The maximum width W2 of the second sub trench 162*b* in the second direction Y may be smaller than a maximum width W3 of the third sub trench 162*c* in the second direction Y.

In some embodiments, a maximum depth H1 of the first sub trench 162*a* in the third direction Z may be smaller than a maximum depth H2 of the second sub trench 162*b* in the third direction Z. The maximum depth H2 of the second sub trench 162*b* in the third direction Z may be smaller than a maximum depth H3 of the third sub trench 162*c* in the third direction Z. For example, a cross-section of the trench 162 may be A-shaped, as shown in FIG. 14B.

According to some embodiments of the present inventive concept, the trench 162 may be formed by forming the first sub trench 162*a*, the second sub trench 162*b* and the third sub trench 162*c* using respective sub trench forming processes. Accordingly, even if a distance between gate electrodes 147 is small, the trench 162 may have a width wider enough between the gate electrodes 147. As appreciated by the present inventors, a trench that is formed by a single trench forming process may have a width not wider enough between gate electrodes 147. A trench that is formed by a single trench forming process may have a width that decreases monotonically from a top surface to a bottom surface of the active fin 120 such that a distance between a channel and the trench may increase. Accordingly, function of the semiconductor pattern in the trench, a source/drain, may deteriorate. The trench 162 according to some embodiments of the present inventive concept may be formed by multiple sub trench forming processes, thereby the function of the semiconductor pattern 161 may not deteriorate.

Figure 15:
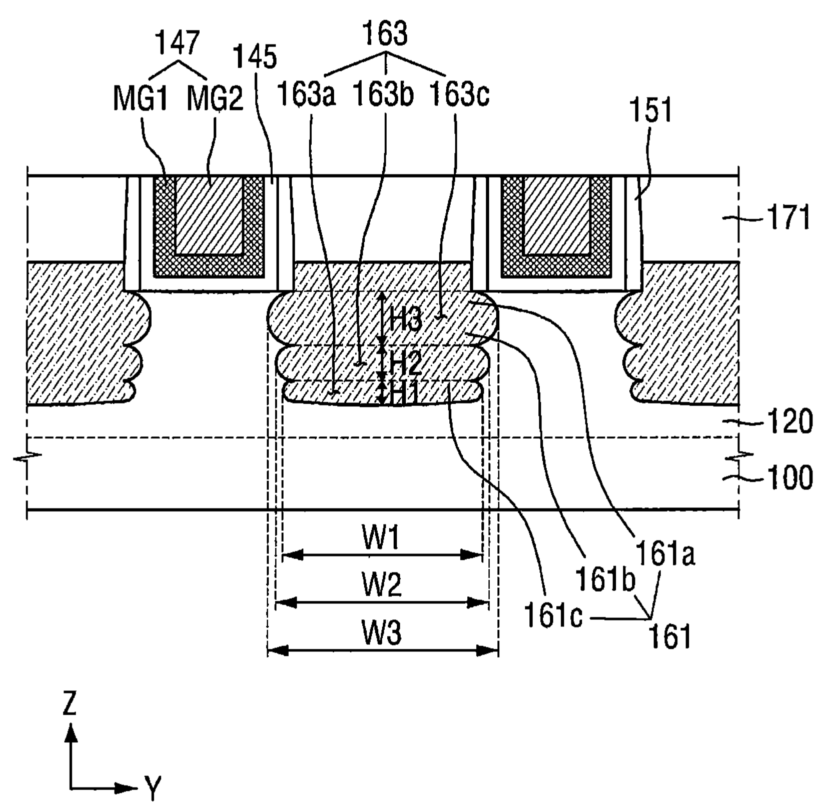
FIG. 15 is a cross-sectional view of an integrated circuit device according to some embodiments of the present inventive concept.

FIG. 15 is a cross-sectional view of an integrated circuit device according to some embodiments of the present inventive concept.

Referring to FIG. 15, an integrated circuit device may include a trench 163 that may include a first sub trench 163*a*, a second sub trench 163*b* and a third sub trench 163*c*.

The first sub trench 163*a*, the second sub trench 163*b* and the third sub trench 163*c* may be disposed in a third direction Z. The second sub trench 163*b* may be disposed under the first sub trench 163*a* and the third sub trench 163*c* may be disposed under the second sub trench 163*b* such that the second sub trench 162*b* may be disposed between the first sub trench 162*a* and the third sub trench 162*c*. The semiconductor pattern 161 may have a first segment 161*a* disposed in the first sub trench 163*a*, a second segment 161*b* disposed in the second sub trench 163*b* and a third segment 161*c* disposed in the third sub trench 163*c*.

The first sub trench 163*a*, the second sub trench 163*b* and the third sub trench 163*c* may have respective maximum widths and depths that monotonically decrease along the third direction Z. A maximum width W1 of the first sub trench 163*a* in a second direction Y may be greater than a maximum width W2 of the second sub trench 163*b* in the second direction Y. The maximum width W2 of the second sub trench 163*b* in the second direction Y may be greater than a maximum width W3 of the third sub trench 163*c* in the second direction Y.

A maximum depth H1 of the first sub trench 163*a* in the third direction Z may be greater than a maximum depth H2 of the second sub trench 163*b* in the third direction Z. The maximum depth H2 of the second sub trench 163*b* in the third direction Z may be greater than a maximum depth H3 of the third sub trench 163*c* in the third direction Z. In some embodiments, a cross-section of the trench 163 may be V-shaped, as shown in FIG. 15.

Figure 16A:
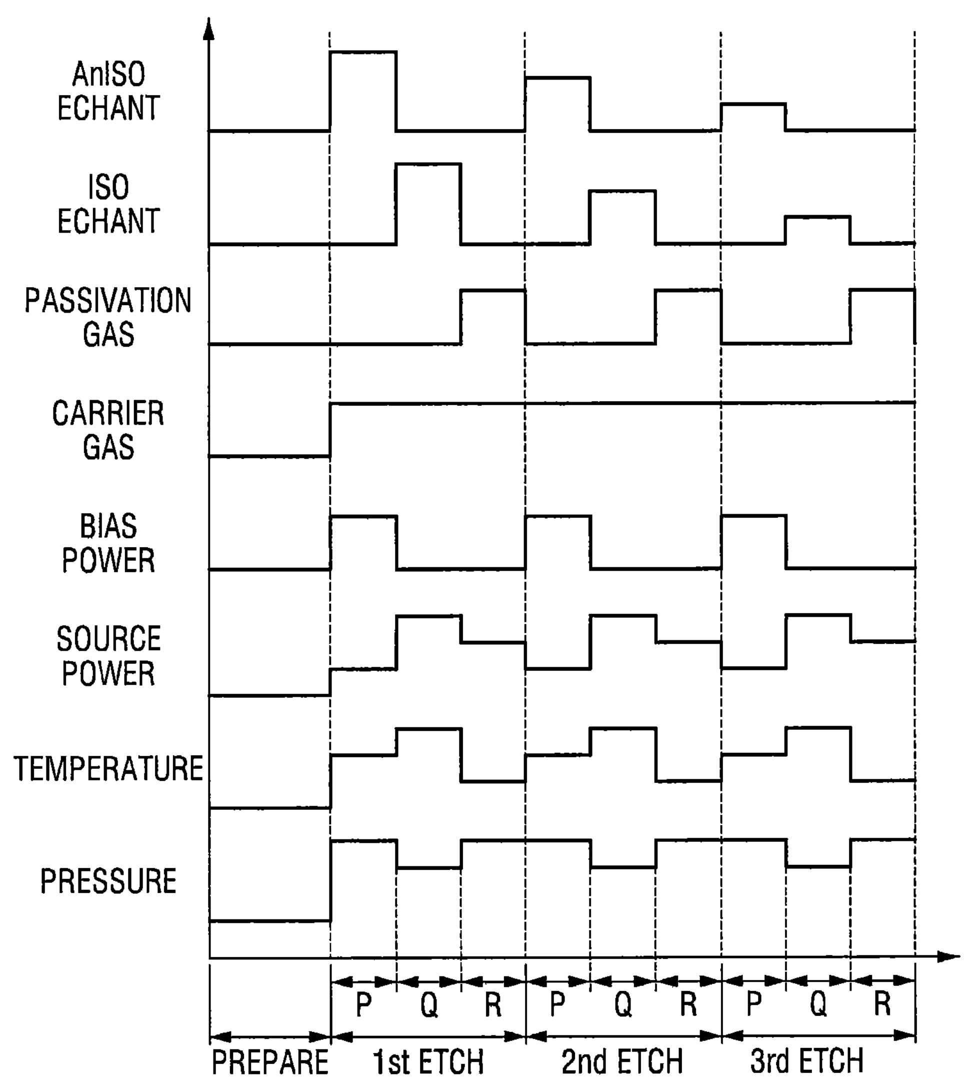
FIGS. 16A and 16B are diagrams illustrating a method of forming an integrated circuit device according to some embodiments of the present inventive concept.
Figure 16B:
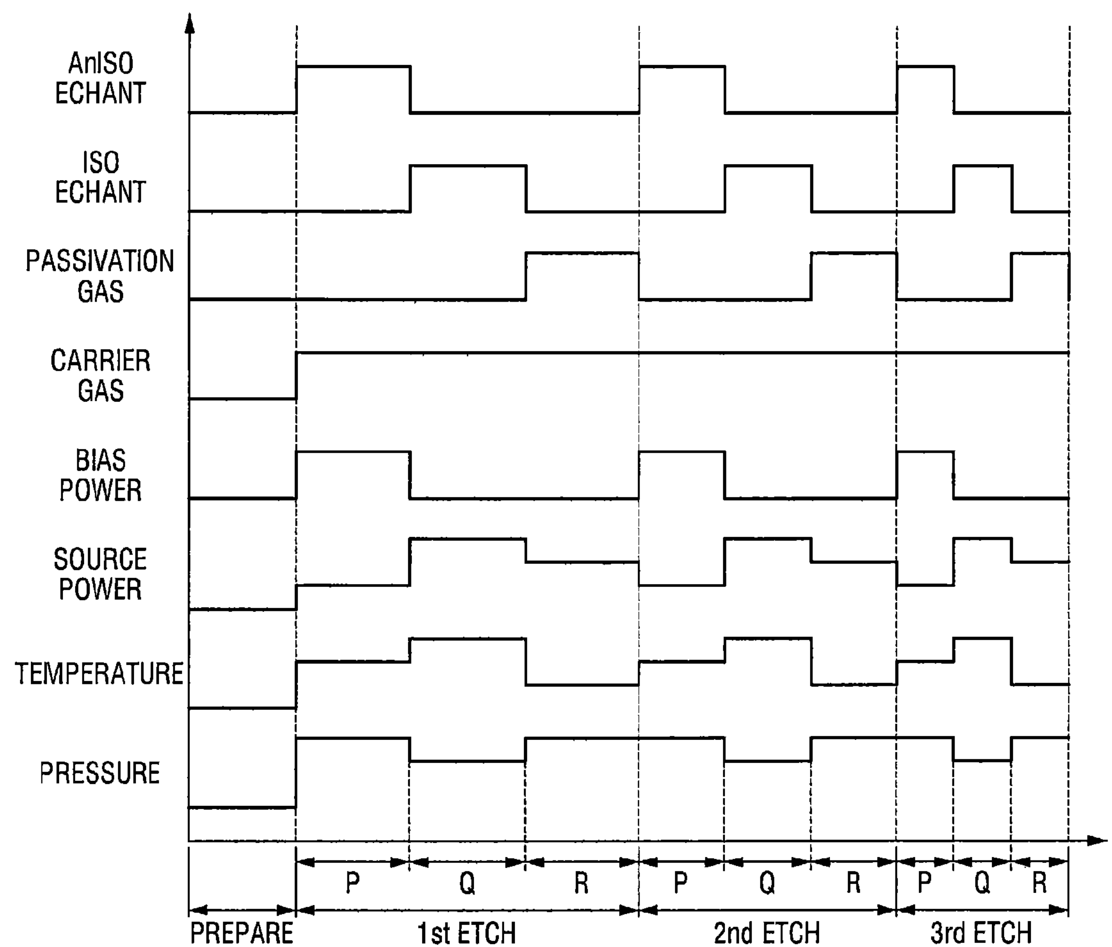

FIGS. 16A and 16B are diagrams illustrating a method of forming an integrated circuit device according to some embodiments of the present inventive concept.

Referring to FIG. 16A, an active fin 120 may be etched using a first etchant of a first concentration with a bias voltage during a period P of a first etching process. The active fin 120 may be etched using a second etchant of a second concentration without a bias voltage during a period Q of the first etching process. The active fin 120 may be passivated using a passivation gas during a period R of the first etching process. Accordingly, the first sub trench 163*a* may be formed, as shown in FIG. 15.

The first etchant and the second etchant may be substantially the same. For example, the first and second etchants may include $CF_4$, $NF_4$ or $SF_6$ and the passivation gas may include O2, N2, or C4F8. However, the first etchant, the second etchant and the passivation gas are not limited thereto.

The active fin 120 may be etched using a third etchant of a third concentration with a bias voltage during a period P of a second etching process. The active fin 120 may be etched using a fourth etchant of a fourth concentration without a bias voltage during a period Q of the second etching process. The etched active fin 120 may be passivated using a passivation gas during a period R of the second etching process. After performing the second etching process, the second sub trench 163*b* may be formed under the first sub trench 163*a*, as shown in FIG. 15.

In some embodiments, the third concentration may be lower than the first concentration and the fourth concentration may be lower than the second concentration. Therefore, the second sub trench 163*b* may be smaller than the first sub trench 163*a* in size.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 16A, the active fin 120 may be etched using a fifth etchant of a fifth concentration with a bias voltage during a period P of a third etching process. The active fin 120 may be etched using a sixth etchant of a sixth concentration without a bias voltage during a period Q of the third etching process. The etched active fin 120 may be passivated using a passivation gas during a period R of the third etching process. After performing the third etching process, the third sub trench 163*c* may be formed under the second sub trench 163*b*, as shown in FIG. 15.

In some embodiments, the fifth concentration may be lower than the third concentration and the sixth concentration may be lower than the fourth concentration. Therefore, the third sub trench 163*c* may be smaller than the second sub trench 163*b* in size, as shown in FIG. 15.

In some embodiments, the fifth etchant and the sixth etchant may be substantially the same. In some embodiments, the fifth etchant and the first etchant may be substantially the same and the sixth etchant and the second etchant may be substantially the same. However, the fifth etchant and the sixth etchant are not limited thereto.

The first etchant of the first etching process, the third etchant of the second etching process and the fifth etchant of the third etching process may include substantially the same chemical components but may have different concentrations. The second etchant of the first etching process, the fourth etchant of the second etching process and the sixth etchant of the third etching process may include substantially the same chemical components but may have different concentrations. Therefore, the first sub trench 163*a*, the second sub trench 163*b* and the third sub trench 163*c* may have different sizes.

It will be understood that the trench 163 shown in FIG. 15 may be formed using various methods. In some embodiments, the trench 163 may be formed using a method illustrated in FIG. 16B.

Referring to FIG. 16B, the active fin 120 may be etched using a first etchant with a bias voltage during a period P of a first etching process. The active fin 120 may be etched using a second etchant without a bias voltage during a period Q of the first etching process. The etched active fin 120 may be passivated using a passivation gas during a period R of the first etching process. Accordingly, the first sub trench 163*a* may be formed, as shown in FIG. 15.

In some embodiments, the first and second etchants may be substantially the same. For example, the first and second etchants may include CF4, NF4, or SF6 and the passivation gas may include O2, N2, or C4F8. However, the first and second etchants and the passivation gas are not are not limited thereto.

The active fin 120 may be etched using a third etchant with a bias voltage during a period P of a second etching process. The active fin 120 may be etched using a fourth etchant without a bias voltage during a period Q of the second etching process. The etched active fin 120 may be passivated using a passivation gas during a period R of the second etching process. After performing the second etching process, the second sub trench 163*b* may be formed under the first sub trench 163*a*, as shown in FIG. 15.

In some embodiments, the period P of the second etching process may be shorter than the period P of the first etching process and the period Q of the second etching process may be shorter than the period Q of the first etching process. Therefore, the second sub trench 163*b* may be smaller than the first sub trench 163*a* in size.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 16B, the active fin 120 may be etched using a fifth etchant with a bias voltage during a period P of a third etching process. The active fin 120 may be etched using a sixth etchant without a bias voltage during a period Q of the third etching process. The etched active fin 120 may be passivated using a passivation gas during a period R of the third etching process. After performing the third etching process, the third sub trench 163*c* may be formed under the second sub trench 163*b*, as shown in FIG. 15.

In some embodiments, the period P of the third etching process may be shorter than the period P of the second etching process and the period Q of the third etching process may be shorter than the period Q of the second etching process. Therefore, the third sub trench 163*c* may be smaller than the second sub trench 163*b* in size, as shown in FIG. 15.

In some embodiments, the fifth etchant and the sixth etchant may be substantially the same. In some embodiments, the fifth etchant and the first etchant may be substantially the same and the sixth etchant and the second etchant may be the same. However, the fifth etchant and the sixth etchant are not limited thereto.

In some embodiments, the first etchant of the first etching process, the third etchant of the second etching process and the fifth etchant of the third etching process may include substantially the same chemical components and may have substantially the same concentration. The second etchant of the first etching process, the fourth etchant of the second etching process and the sixth etchant of the third etching process may include substantially the same chemical components and may have substantially the same concentration. However, the period P of the first etching process, the period P of the second etching process and the period P of the third etching process may be different, the period Q of the first etching process, the period Q of the second etching process and the period Q of the third etching process may be different and the period R of the first etching process, the period R of the second etching process and the period R of the third etching process may be different. Therefore, the first sub trench 163*a*, the second sub trench 163*b* and the third sub trench 163*c* may have different sizes.

Figure 17:
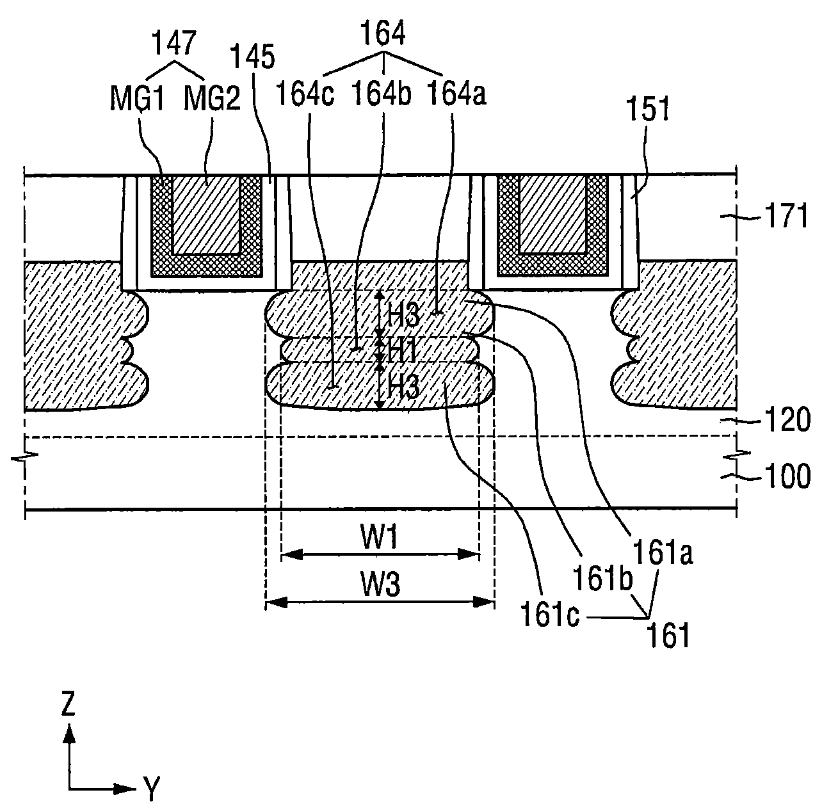
FIG. 17 is a cross-sectional view of an integrated circuit device according to some embodiments of the present inventive concept.

FIG. 17 is a cross-sectional view of an integrated circuit device according to some embodiments of the present inventive concept.

Referring to FIG. 17, an integrated circuit device according to some embodiments of the present inventive concept may include a trench 164 that may include a first sub trench 164*a*, a second sub trench 164*b* and a third sub trench 164*c*.

As shown in FIG. 17, the first sub trench 164*a*, the second sub trench 164*b* and the third sub trench 164*c* may be disposed along a third direction Z. The second sub trench 164*b* may be disposed under the first sub trench 164*a* and the third sub trench 164*c* may be disposed under the second sub trench 164*b*. The semiconductor pattern 161 may have a first segment 161*a* disposed in the first sub trench 164*a*, a second segment 161*b* disposed in the second sub trench 164*b* and a third segment 161*c* disposed in the third sub trench 164*c*.

In some embodiments, the first sub trench 164*a*, the second sub trench 164*b* and the third sub trench 164*c* may have different widths and depths. A maximum width W1 of the first sub trench 164*a* in a second direction Y may be greater than a maximum width W2 of the second sub trench 164*b* in the second direction Y. The maximum width W2 of the second sub trench 164*b* in the second direction Y may be smaller than a maximum width W3 of the third sub trench 164*c* in the second direction Y.

A maximum depth H1 of the first sub trench 164*a* in the third direction Z may be greater than a maximum depth H2 of the second sub trench 164*b* in the third direction Z. The maximum depth H2 of the second sub trench 164*b* in the third direction Z may be smaller than a maximum depth H3 of the third sub trench 164*c* in the third direction Z. In some embodiments, a cross-section of the trench 164 may be 8-shaped, as shown in FIG. 17.

Figure 18A:
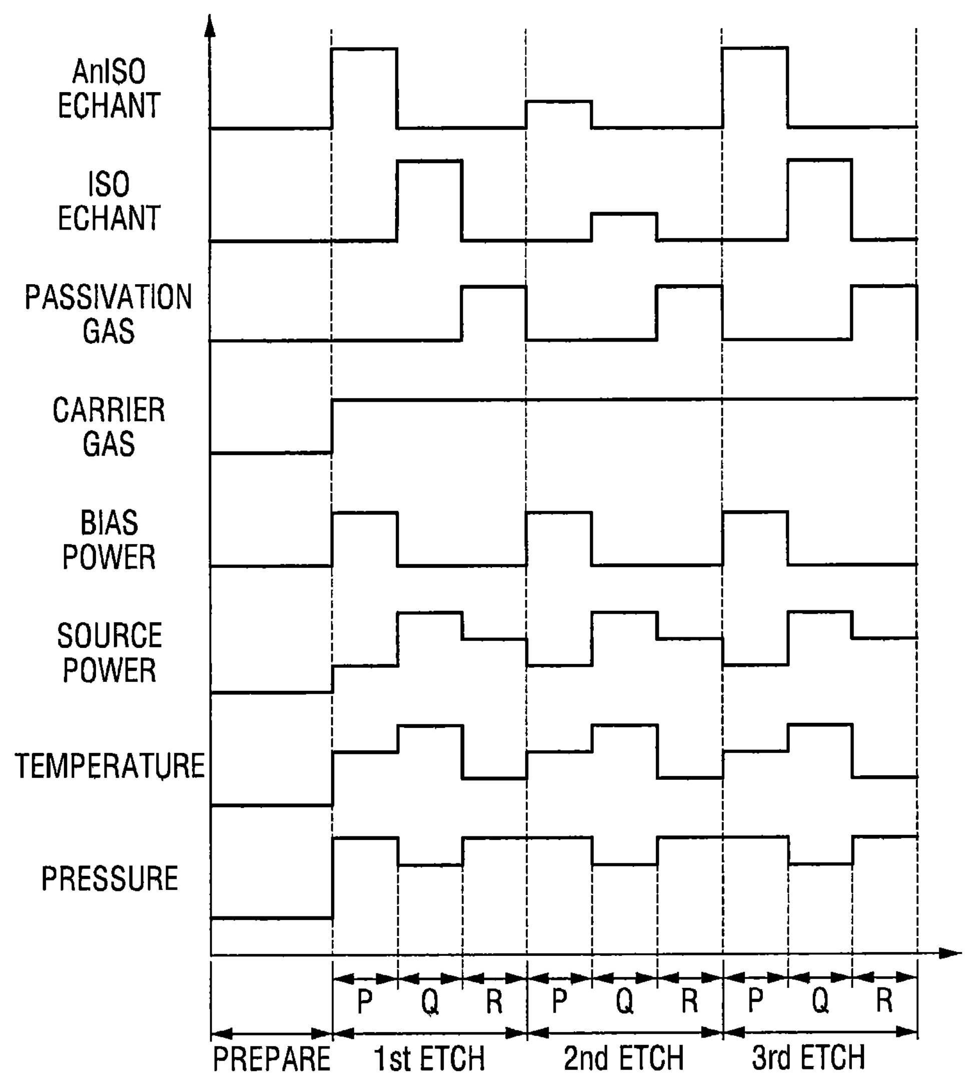
FIGS. 18A and 18B are diagrams illustrating a method of forming an integrated circuit device according to some embodiments of the present inventive concept.
Figure 18B:
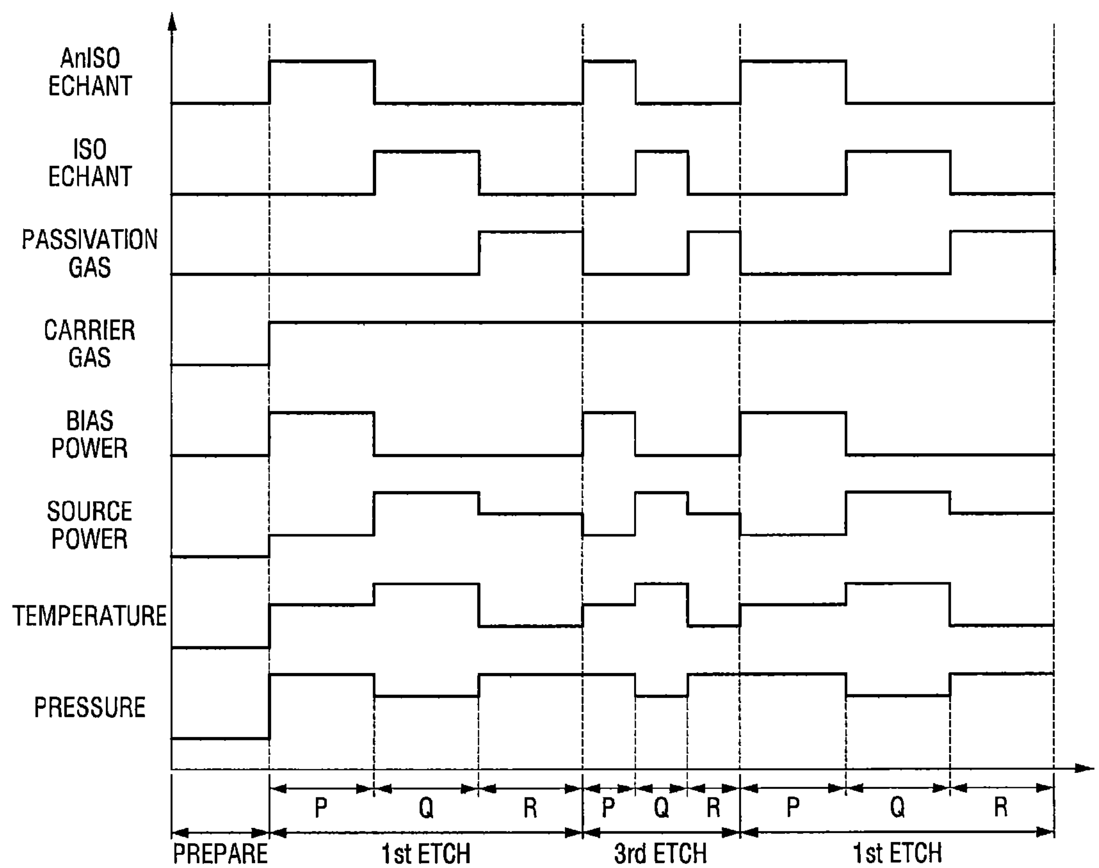

FIGS. 18A and 18B are diagrams illustrating a method of forming an integrated circuit device according to some embodiments of the present inventive concept.

Referring to FIG. 18A, the active fin 120 may be etched using a first etchant of a first concentration with a bias voltage during a period P of a first etching process. The active fin 120 may be etched using a second etchant of a second concentration without a bias voltage during a period Q of the first etching process. The etched active fin 120 may be passivated using a passivation gas during a period R of the first etching process. Accordingly, the first sub trench 164*a* may be formed, as shown in FIG. 17.

In some embodiments, the first and second etchants may be substantially the same. For example, the first and second etchants may include $CF_4$, $NF_4$, or $SF_6$ and the passivation gas may include $O_2$, $N_2$, or $C_4F_8$. However, the first and second etchants and the passivation gas are not limited thereto.

The active fin 120 may be etched using a third etchant of a third concentration with a bias voltage during a period P of a second etching process. The active fin 120 may be etched using a fourth etchant of a fourth concentration without a bias voltage during a period Q of the second etching process. The etched active fin 120 may be passivated using a passivation gas during a period R of the second etching process. After performing the second etching process, the second sub trench 164*b* may be formed under the first sub trench 164*a*, as shown in FIG. 17.

In some embodiments, the third concentration may be lower than the first concentration and the fourth concentration may be lower than the second concentration. The second sub trench 164*b* may thus be smaller than the first sub trench 164*a* in size.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 18A, the active fin 120 may be etched using a fifth etchant of a fifth concentration with a bias voltage during a period P of a third etching process. The active fin 120 may be etched using a sixth etchant of a sixth concentration without a bias voltage during a period Q of the third etching process. The etched active fin 120 may be passivated using a passivation gas during a period R of the third etching process. After performing the third etching process, the third sub trench 164*c* may be formed under the second sub trench 164*b*, as shown in FIG. 17.

In some embodiments, the fifth concentration may be higher than the third concentration and the sixth concentration may be higher than the fourth concentration. The third sub trench 164*c* may thus be larger than the second sub trench 164*b* in size.

In some embodiments, the fifth etchant and the sixth etchant may be substantially the same. In some embodiments, the fifth etchant and the first etchant may be substantially the same and the sixth etchant and the second etchant may be substantially the same. However, of the fifth etchant and the sixth etchant are not limited thereto.

In some embodiments, the first etchant of the first etching process, the third etchant of the second etching process and the fifth etchant of the third etching process may include substantially the same chemical components but may not have substantially the same concentration. The second etchant of the first etching process, the fourth etchant of the second etching process and the sixth etchant of the third etching process may include substantially the same chemical components but may not have substantially the same concentration. Therefore, at least two of the first sub trench 164*a*, the second sub trench 164*b* and the third sub trench 164*c* may have different sizes.

It will be understood that the trench 164 shown in FIG. 17 may be formed using various methods. In some embodiments, the trench 164 may be formed using a method illustrated in FIG. 18B.

Referring to FIG. 18B, the active fin 120 may be etched using a first etchant with a bias voltage during a period P of a first etching process. The active fin 120 may be etched using a second etchant without a bias voltage during a period Q of the first etching process. The etched active fin 120 may be passivated using a passivation gas during a period R of the first etching process. Accordingly, the first sub trench 164*a* may be formed, as shown in FIG. 17.

In some embodiments, the first and second etchants may be substantially the same. For example, the first and second etchants may include $CF_4$, $NF_4$, or $SF_6$ and the passivation gas may include $O_2$, $N_2$, or $C_4F_8$. However, the first and second etchants and the passivation gas are not limited thereto.

The active fin 120 may be etched using a third etchant with a bias voltage during a period P of a second etching process. The active fin 120 may be etched using a fourth etchant without a bias voltage during a period Q of the second etching process. The etched active fin 120 may be passivated using a passivation gas during a period R of the second etching process. After performing the second etching process, the second sub trench 164*b* may be formed under the first sub trench 164*a*, as shown in FIG. 17.

In some embodiments, the period P of the second etching process may be shorter than the period P of the first etching process and the period Q of the second etching process may be shorter than the period Q of the first etching process. Therefore, the second sub trench 164*b* may be smaller than the first sub trench 164*a* in size.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 18B, the active fin 120 may be etched using a fifth etchant with a bias voltage during a period P of a third etching process. The active fin 120 may be etched using a sixth etchant without a bias voltage during a period Q of the third etching process. The etched active fin 120 may be passivated using a passivation gas during a period R of the third etching process. After performing the third etching process, the third sub trench 164*c* may be formed under the second sub trench 164*b*, as shown in FIG. 17.

In some embodiments, the period P of the third etching process may be longer than the period P of the second etching process and the period Q of the third etching process may be longer than the period Q of the second etching process. Therefore, the third sub trench 164*c* may be larger than the second sub trench 164*b* in size.

In some embodiments, the fifth etchant and the sixth etchant may be substantially the same. In some embodiments, the fifth etchant and the first etchant may be substantially the same and the sixth etchant and the second etchant may be the same. However, the fifth etchant and the sixth etchant are not limited thereto.

The first etchant of the first etching process, the third etchant of the second etching process and the fifth etchant of the third etching process may include substantially the same chemical components and may have substantially the same concentration. The second etchant of the first etching process, the fourth etchant of the second etching process and the sixth etchant of the third etching process may include substantially the same chemical components and may have substantially the same concentration. However, the period P of the first etching process, the period P of the second etching process and the period P of the third etching process may not be substantially the same, the period Q of the first etching process, the period Q of the second etching process and the period Q of the third etching process may not be substantially the same and the period R of the first etching process, the period R of the second etching process and the period R of the third etching process may not be substantially the same. Therefore, at least two of the first sub trench 164*a*, the second sub trench 164*b* and the third sub trench 164*c* may have different sizes.

Figure 19:
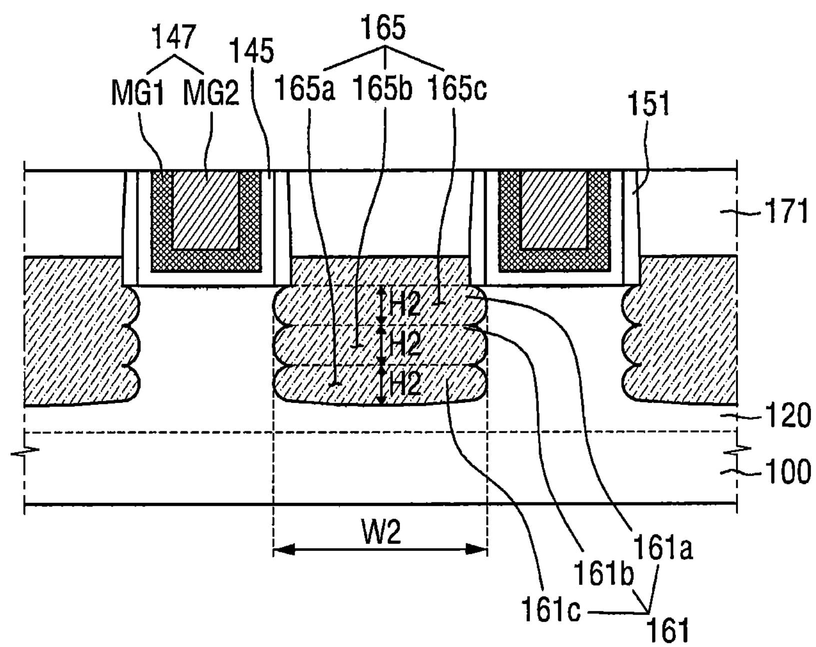
FIG. 19 is a cross-sectional view of an integrated circuit device according to some embodiments of the present inventive concept.

FIG. 19 is a cross-sectional view of an integrated circuit device according to some embodiments of the present inventive concept.

Referring to FIG. 19, an integrated circuit device according to some embodiments of the present inventive concept may include a trench 165 that may include a first sub trench 165*a*, a second sub trench 165*b* and a third sub trench 165*c*.

As shown in FIG. 19, the first sub trench 165*a*, the second sub trench 165*b* and the third sub trench 165*c* may be disposed along a third direction Z. The second sub trench 165*b* may be disposed under the first sub trench 165*a* and the third sub trench 165*c* may be disposed under the second sub trench 165*b*. The semiconductor pattern 161 may have a first segment 161*a* disposed in the first sub trench 165*a*, a second segment 161*b* disposed in the second sub trench 165*b* and a third segment 161*c* disposed in the third sub trench 165*c*.

In some embodiments, the first sub trench 165*a*, the second sub trench 165*b* and the third sub trench 165*c* may have respective maximum widths and depths that are substantially the same. For example, a cross-section of the trench 165 may be U-shaped, as shown in FIG. 19.

Figure 20:
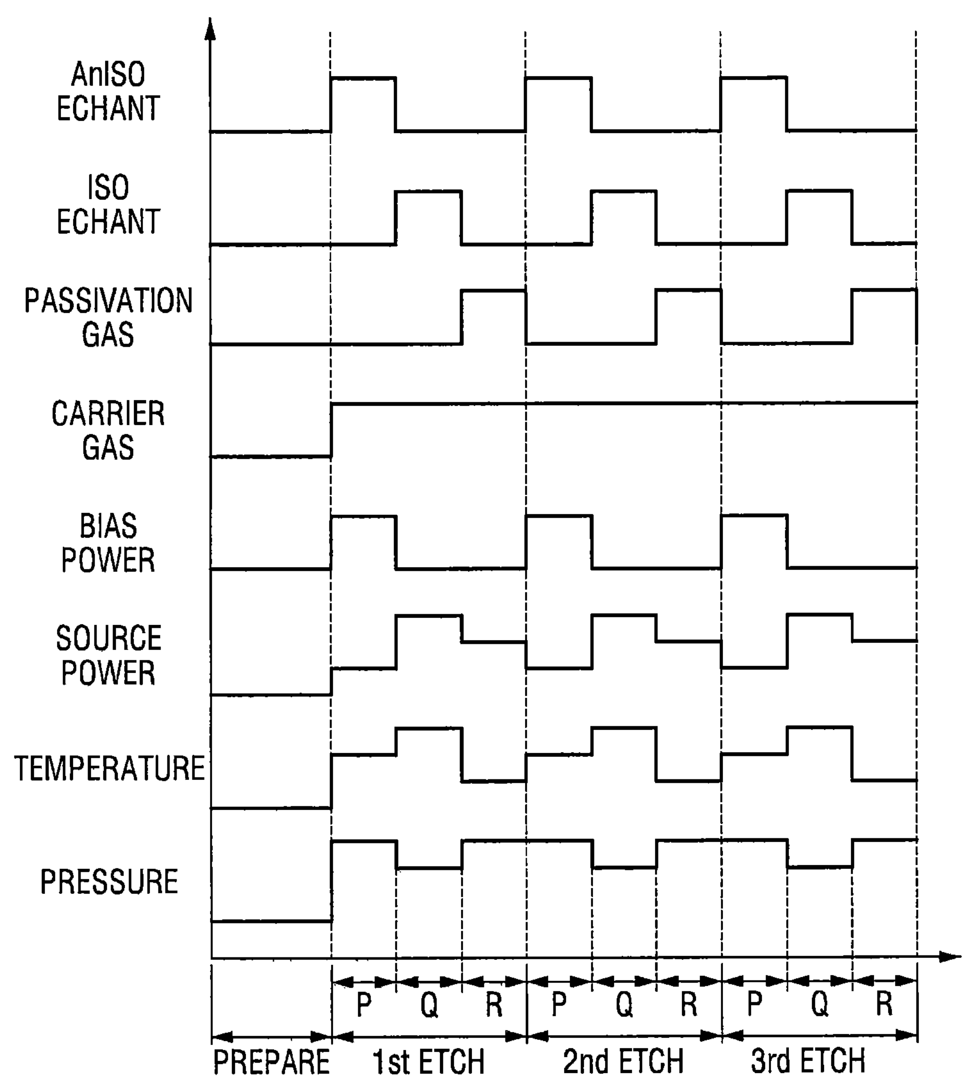
FIG. 20 is a diagram illustrating a method of forming an integrated circuit device according to some embodiments of the present inventive concept.

FIG. 20 is a diagram illustrating a method of forming an integrated circuit device according to some embodiments of the present inventive concept.

Referring to FIG. 20, the active fin 120 may be etched using a first etchant of a first concentration with a bias voltage during a period P of a first etching process. The active fin 120 may be etched using a second etchant of a second concentration without a bias voltage during a period Q of the first etching process. The etched active fin 120 may be passivated using a passivation gas during a period R of the first etching process. Accordingly, the first sub trench 165*a* may be formed, as shown in FIG. 19.

In some embodiments, the first and second etchants may be substantially the same. For example, the first and second etchants may include $CF_4$, $NF_4$, or $SF_6$ and the passivation gas may include $O_2$, $N_2$, or $C_4F_8$. However, the first and second etchants and the passivation gas are not limited thereto.

The active fin 120 may be etched using a third etchant of a third concentration with a bias voltage during a period P of a second etching process. The active fin 120 may be etched using a fourth etchant of a fourth concentration without a bias voltage during a period Q of the second etching process. The etched active fin 120 may be passivated using a passivation gas during a period R of the second etching process. After performing the second etching process, the second sub trench 165*b* may be formed under the first sub trench 165*a*, as shown in FIG. 19.

In some embodiments, the third etchant and the fourth etchant may be substantially the same. In some embodiments, the third etchant and the first etchant may be substantially the same and the fourth etchant and the second etchant may be substantially the same. However, the third etchant and the fourth etchant are not limited thereto.

Still referring to FIG. 20, the active fin 120 may be etched using a fifth etchant of a fifth concentration with a bias voltage during a period P of a third etching process. The active fin 120 may be etched using a sixth etchant of a sixth concentration without a bias voltage during a period Q of the third etching process. The etched active fin 120 may be passivated using a passivation gas during a period R of the third etching process. After performing the third etching process, the third sub trench 165*c* may be formed under the second sub trench 165*b*, as shown in FIG. 19.

In some embodiments, the fifth etchant and the sixth etchant may be substantially the same. In some embodiments, the fifth etchant and the first etchant may be substantially the same and the sixth etchant and the second etchant may be substantially the same. However, the fifth etchant and the sixth etchant are not limited thereto.

The first etchant of the first etching process, the third etchant of the second etching process and the fifth etchant of the third etching process may include substantially the same chemical components and may have substantially the same concentration. The second etchant of the first etching process, the fourth etchant of the second etching process and the sixth etchant of the third etching process may include substantially the same chemical components and may have substantially the same concentration. Further, the period P of the first etching process, the period P of the second etching process and the period P of the third etching process may be substantially the same, the period Q of the first etching process, the period Q of the second etching process and the period Q of the third etching process may be substantially the same and the period R of the first etching process, the period R of the second etching process and the period R of the third etching process may be substantially the same. Therefore, the first sub trench 165*a*, the second sub trench 165*b* and the third sub trench 165*c* may have substantially the same size.

Figure 21:
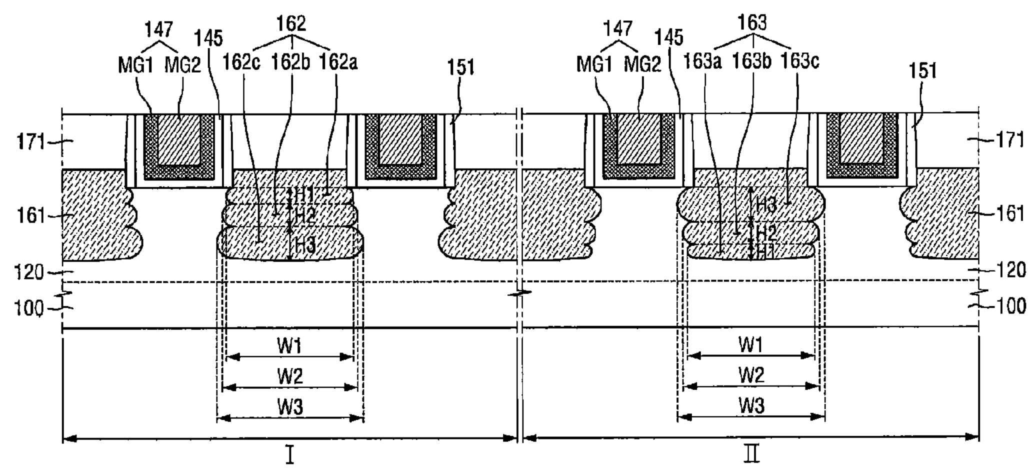
FIGS. 21, 22 and 23 are cross-sectional views of an integrated circuit device according to some embodiments of the present inventive concept.
Figure 22:
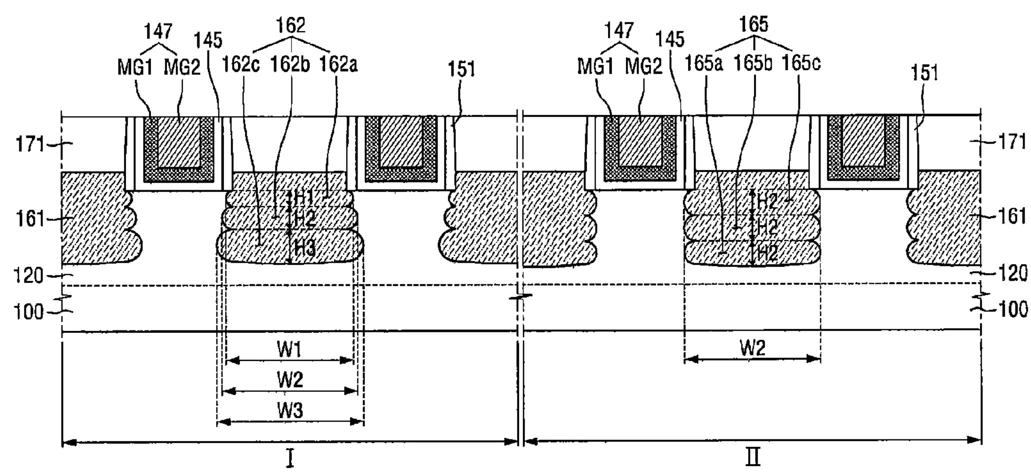
Figure 23:
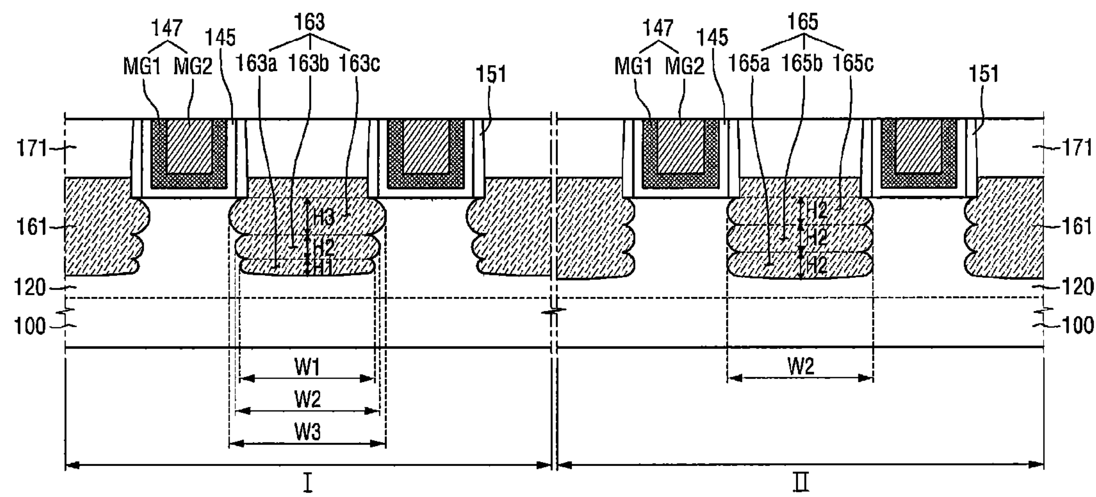

FIGS. 21, 22 and 23 are cross-sectional views of an integrated circuit device according to some embodiments of the present inventive concept.

Referring to FIG. 21, an integrated circuit device according to some embodiments of the present inventive concept may include a first region I and a second region II. The above-described A-shaped trench 162 may be formed in the active fin 120 of the first region I and the above-described V-shaped trench 163 may be formed in the active fin 120 of the second region II.

In some embodiments, the semiconductor pattern 161 formed in the first region I and the semiconductor pattern 161 formed in the second region II may have different conductivity types. For example, the semiconductor pattern 161 formed in the first region I and the semiconductor pattern 161 formed in the second region II may be doped with dopants having different conductivity types.

In some embodiments, the gate electrode 147 formed in the first region I and the gate electrode 147 formed in the second region II may have different gate pitches.

Referring to FIG. 22, an integrated circuit device according to some embodiments of the present inventive concept may include a first region I and a second region II. The above-described A-shaped trench 162 may be formed in the active fin 120 of the first region I and the above-described U-shaped trench 165 may be formed in the active fin 120 of the second region II.

In some embodiments, the semiconductor pattern 161 formed in the first region I and the semiconductor pattern 161 formed in the second region II may have different conductivity types. For example, the semiconductor pattern 161 formed in the first region I and the semiconductor pattern 161 formed in the second region II may be doped with dopants having different conductivity types.

In some embodiments, the gate electrode 147 formed in the first region I and the gate electrode 147 formed in the second region II may have different gate pitches.

Referring to FIG. 23, an integrated circuit device according to some embodiments of the present inventive concept may include a first region I and a second region II. The above-described V-shaped trench 163 may be formed in the active fin 120 of the first region I and the above-described U-shaped trench 165 may be formed in the active fin 120 of the second region II.

In some embodiments, the semiconductor pattern 161 formed in the first region I and the semiconductor pattern 161 formed in the second region II may have different conductivity types. For example, the semiconductor pattern 161 formed in the first region I and the semiconductor pattern 161 formed in the second region II may be doped with dopants having different conductivity types.

In some embodiments of the present inventive concept, the gate electrode 147 formed in the first region I and the gate electrode 147 formed in the second region II may have different gate pitches.

Figure 24:
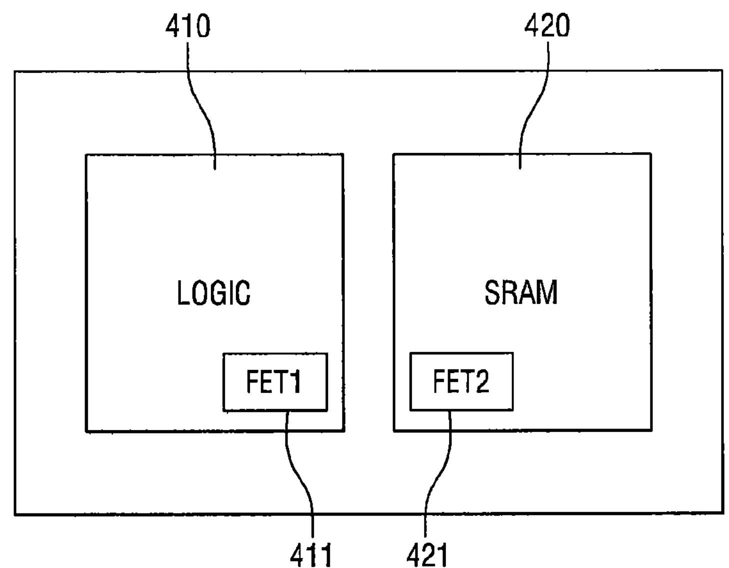
FIGS. 24 and 25 are diagrams illustrating an integrated circuit device according to some embodiments of the present inventive concept.
Figure 25:
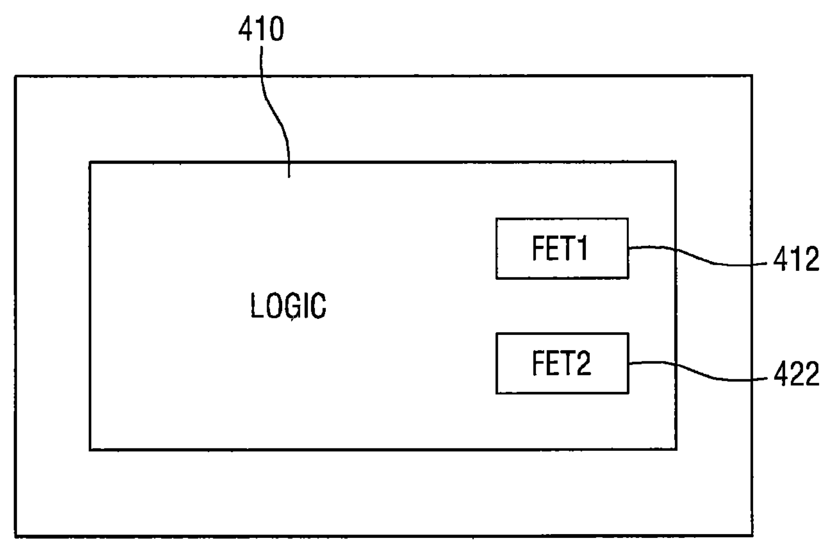

FIGS. 24 and 25 are diagrams illustrating an integrated circuit device according to some embodiments of the present inventive concept.

Referring to FIG. 24, an integrated circuit device 13 may include a logic region 410 and an SRAM region 420. A first field effect transistor (FET1) 411, may be disposed in the logic region 410 and a second field effect transistor (FET2) 421 may be disposed in the SRAM region 420.

In some embodiments of the present inventive concept, the first transistor 411 and the second transistor 421 may have structure different from each other. For example, a source/drain of the first transistor 411 may have the A-shaped trench (e.g., 162 of FIG. 21), and a source/drain of the second transistor 421 may have the V-shaped trench (e.g., 163 of FIG. 21), but the first transistor 411 and the second transistor 421 are not limited thereto.

In FIG. 24, the logic region 410 and the SRAM region 420 are illustrated as an example, but aspects of the present inventive concept are not limited thereto. For example, the present inventive concept may also be applied to the logic region 410 and other memory regions (e.g., DRAM, MRAM, RRAM, or PRAM).

Referring to FIG. 25, an integrated circuit device 14 may include a logic region 410. A first field effect transistor (FET1) 412 and a second field effect transistor (FET2) 422 may have structure different from each other and may be disposed in the logic region 410.

In some embodiments of the present inventive concept, the first and second transistors 412 and 422 may have structures different from each other. For example, a source/drain of the first transistor 412 may be formed in the A-shaped trench (162 of FIG. 22), and a source/drain of the second transistor 422 may be formed in the U-shaped trench (165 of FIG. 22), but not limited thereto.

Figure 26:
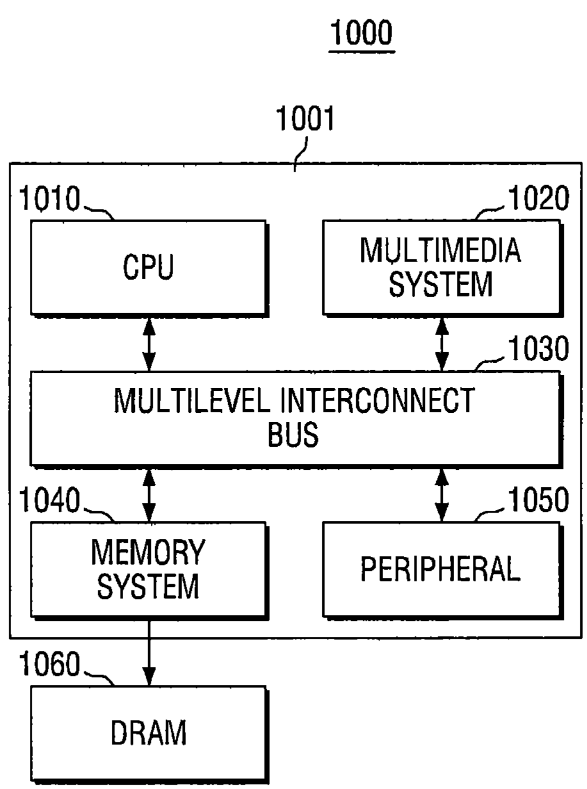
FIG. 26 is a block diagram of a System on Chip (SoC) system including an integrated circuit device according to some embodiments of the present inventive concept.

FIG. 26 is a block diagram of a System on Chip (SoC) including an integrated circuit device according to some embodiments of the present inventive concept.

Referring to FIG. 26, an SoC system 1000 may include an application processor 1001 and a DRAM 1060.

The application processor 1001 may include a central processing unit (CPU) 1010, a multimedia system 1020, a multilevel interconnect bus 103Q, a memory system 1040, and a peripheral circuit (PERIPHERAL) 1050.

The CPU 1010 may perform operations to drive the SoC system 1000. In some embodiments, the CPU 1010 may include a multi core processor including a plurality of cores.

The multimedia system 1020 may be used when the SoC system 1000 performs various multimedia functions. The multimedia system 1020 may include, for example, a 3D engine module, a video codec, a display system, a camera system and/or a post-processor.

The multilevel interconnect bus 1030 may be used when the CPU 1010, the multimedia system 1020, the memory system 1040, and the peripheral circuit 1050 perform data communication with one another. In some embodiments, the multilevel interconnect bus 1030 may have a multi-layer structure. For example, the multilevel interconnect bus 1030 may include a multi-layer advanced high-performance bus (AHB) or a multi-layer advanced eXtensible interface (AXI), but not limited thereto.

The memory system 1040 may provide an environment required for high-speed operation of the application processor 1001 connected to an external memory (for example, DRAM 1060). In some embodiments of the present inventive concept, the memory system 1040 may include a separate controller (for example, a DRAM controller) to control the external memory (for example, DRAM 1060).

The peripheral circuit 1050 may provide an environment required for smooth connection with an external device (for example, a main board). Accordingly, the peripheral circuit 1050 may include various interfaces allowing the external device connected to the SoC system 1000 to be compatibly used.

The DRAM 1060 may function as a working memory to operate the application processor 1001. In some embodiments of the present inventive concept, as shown, the DRAM 1060 may be outside the application processor 1001. For example, the DRAM 1060 may be packaged with the application processor 1001 in the form of a package on package (PoP).

At least one of various components of the SoC system 1000 may include an integrated circuit device according to some embodiments of the present inventive concept.

Figure 27:
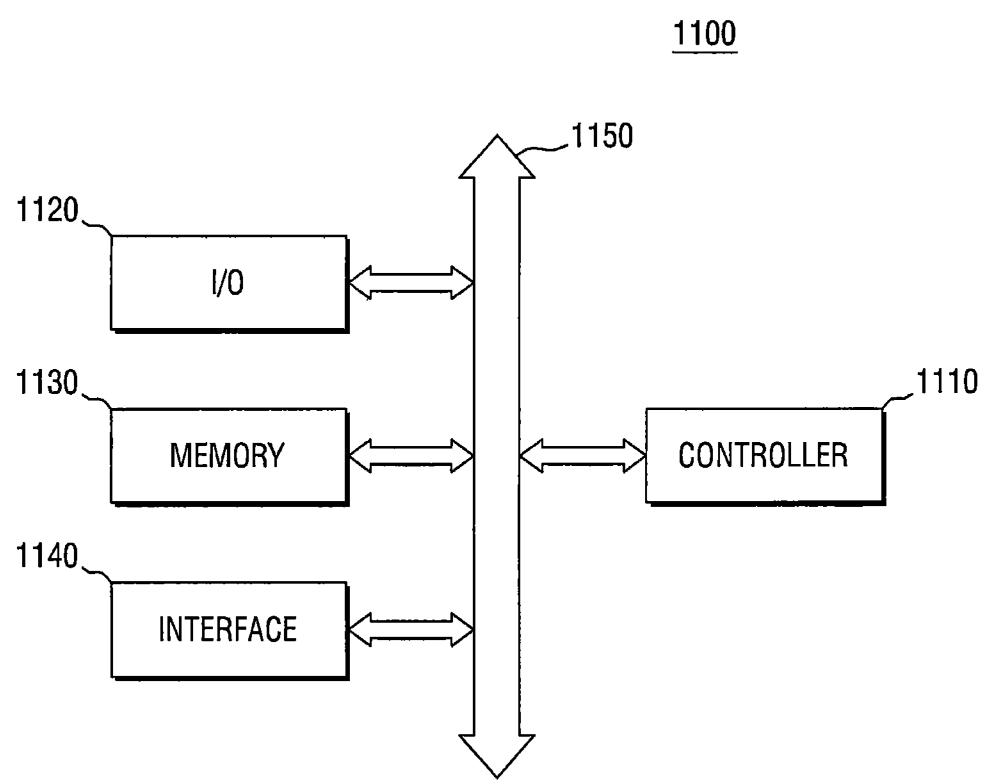
FIG. 27 is a block diagram of an electronic system including an integrated circuit device according to some embodiments of the present inventive concept.

FIG. 27 is a block diagram of an electronic system including an integrated circuit device according to some embodiments of the present inventive concept.

Referring to FIG. 27, an electronic system 1100 according to some embodiments of the present inventive concept may include a controller 1110, an input/output device (I/O) 1120, a memory 1130, an interface 1140 and a bus 1150. The controller 1110, the I/O 1120, the memory 1130, and/or the interface 1140 may be connected to one another through the bus 1150. The bus 1150 may correspond to a path through which data moves.

The controller 1110 may include at least one of a microprocessor, a digital signal processor, a microcontroller, and logic elements capable of functions similar to those of these elements. The I/O 1120 may include, for example, a keypad, a keyboard or a display device. The memory 1130 may store data and/or commands. The interface 1140 may transmit data to a communication network or receive data from the communication network. The interface 1140 may be wired or wireless. For example, the interface 1140 may include an antenna or a wired/wireless transceiver.

The electronic system 1100 may further include high-speed DRAM and/or SRAM as a working memory to improve operation of the controller 1110. In some embodiments, a working memory of the electronic system 1100 may include an integrated circuit device according to some embodiments of the present inventive concept. The memory 1130, some components of the controller 1110 and/or the I/O 1120 may include an integrated circuit device according to some embodiments of the present inventive concept.

The electronic system 1100 may be a personal digital assistant (PDA), a portable computer, a web tablet, a wireless phone, a mobile phone, a digital music player, a memory card, or any type of electronic device capable of transmitting and/or receiving information in a wireless environment.

Figure 28:
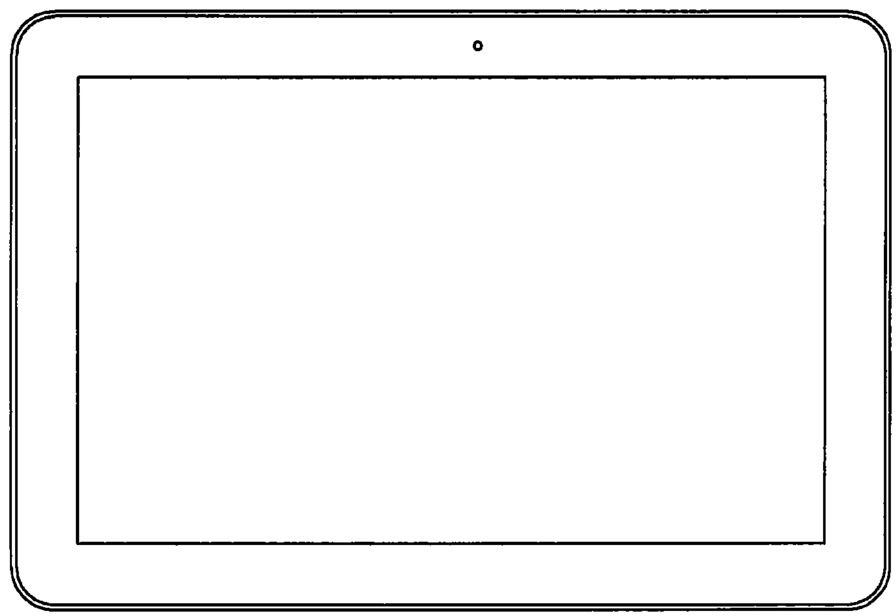
FIGS. 28, 29 and 30 are electronic devices including an integrated circuit device according to some embodiments of the present inventive concept.
Figure 29:
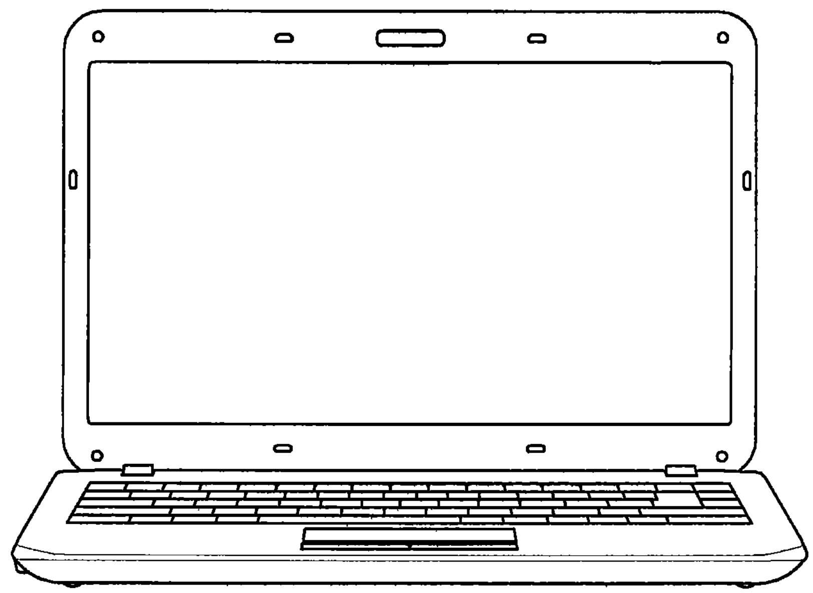
Figure 30:
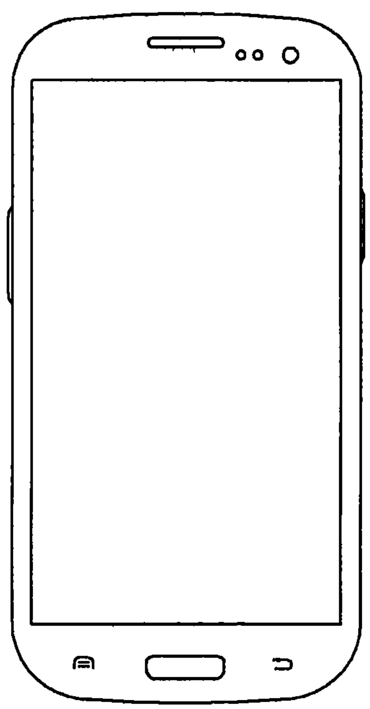

FIGS. 28, 29 and 30 are electronic devices including an integrated circuit device according to some embodiments of the present inventive concept. FIG. 28 illustrates a tablet PC 1200, FIG. 29 illustrates a notebook computer 1300, and FIG. 30 illustrates a cell phone 1400 (e.g., smart phone). The tablet PC 1200, the notebook computer 1300 and the smart phone 1400 may include an integrated circuit device according to some embodiments of the present inventive concept.

It will be understood that other electronic devices not illustrated herein may include an integrated circuit device according to some embodiments of the present inventive concept. For example, an integrated circuit device according to some embodiments may be included in a computer, an ultra mobile personal computer (UMPC), a work station, a net-book, a personal digital assistant (PDA), a portable computer, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, or a digital video player.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:

an active fin protruding from a substrate in a first direction and extending longitudinally in a second direction transverse the first direction;

a gate electrode disposed on the active fin extending longitudinally in a third direction transverse the second direction;

a trench in the active fin adjacent the gate electrode; and a semiconductor pattern in the trench, wherein:

the semiconductor pattern includes a first segment and a second segment, the first and second segments being in the trench and the first segment being disposed between the gate electrode and the second segment;

the first segment has a first maximum width in the second direction that is different from a second maximum width of the second segment in the second direction; and the first segment has a first maximum thickness in the first direction that is different from a second maximum thickness of the second segment in the first direction.

2. The semiconductor device of claim 1, wherein the first maximum width is smaller than the second maximum width.

3. The semiconductor device of claim 2, wherein the first maximum thickness is smaller than the second maximum thickness.

4. The semiconductor device of claim 1, wherein the first maximum thickness is greater than the second maximum thickness.

5. The semiconductor device of claim 4, wherein the first maximum width is greater than the second maximum width.

6. The semiconductor device of claim 1, wherein:

the semiconductor pattern further includes a third segment disposed under the second segment, the second segment being disposed between the first segment and the third segment; and the third segment has a third maximum width in the second direction that is different from the second maximum width of the second segment.

7. The semiconductor device of claim 6, wherein the first maximum width is smaller than the second maximum width that is smaller than the third maximum width.

8. The semiconductor device of claim 6, wherein the first maximum width is greater than the second maximum width that is greater than the third maximum width.

9. The semiconductor device of claim 6, wherein the first maximum width is greater than the second maximum width that is smaller than the third maximum width.

10. The semiconductor device of claim 1, further comprising a gate insulation layer disposed between the gate electrode and the active fin, wherein the gate insulation layer overlies a side of the gate electrode.

11. A semiconductor device, comprising;

a substrate including a first region and a second region;

a first active fin protruding from the substrate in a first direction and extending longitudinally in a second direction transverse the first direction, the first active fin being disposed in the first region;

a second active fin protruding from the substrate in the first direction and extending longitudinally in the second direction, the second active fin being disposed in the second region;

a first trench in the first active fin;

a second trench in the second active fin;

a first semiconductor pattern in the first trench; and a second semiconductor pattern in the second trench, wherein;

the first semiconductor pattern includes a first plurality of segments that are in the first trench and are arranged along the first direction;

the second semiconductor pattern includes a second plurality of segments that are in the second trench and are arranged disposed-along the first direction; and the first plurality of segments and the second plurality of segments have different shapes when viewed in cross section parallel to the second direction.

12. The semiconductor device of claim 11, wherein:

maximum widths of respective ones of the first plurality of segments in the second direction increase monotonically from a top surface to a bottom surface of the first active fin; and maximum widths of respective ones of the second plurality of segments in the second direction increase monotonically from a top surface to a bottom surface of the second active fin.

13. The semiconductor device of claim 11, wherein:

maximum widths of respective ones of the first plurality of segments in the second direction increase monotonically from a top surface to a bottom surface of the first active fin; and maximum widths of respective ones of the second plurality of segments in the second direction are substantially equal to one another.

14. The semiconductor device of claim 11, wherein:

maximum widths of respective ones of the first plurality of segments in the second direction decrease monotonically from a to surface to a bottom surface of the first active fin; and maximum widths of respective ones of the second plurality of segments in the second direction are substantially equal to one another.

15. The semiconductor device of claim 11, wherein the first semiconductor pattern and the second semiconductor pattern have different conductivity types.

16. The semiconductor device of claim 11, further comprising:

a first gate electrode on the first active fin adjacent the first trench, the first gate electrode extending longitudinally in a third direction transverse the second direction; and a second gate electrode on the second active fin adjacent the second trench, the second gate electrode extending longitudinally in the third direction, wherein the first gate electrode and the second gate electrode have different gate pitches.

17. An integrated circuit device, die device comprising:

a gate structure on a surface of a substrate; and a source/drain region in the substrate adjacent the gate structure, the source/drain region comprising a plurality of segments that are in the substrate and are arranged along a vertical direction substantially perpendicular to the surface of the substrate and each of the plurality of segments having a width that varies non-monotonically along the vertical direction when viewed in cross section perpendicular to a longitudinal direction of the gate structure.

18. The integrated circuit device of claim 17, wherein each of the plurality of segments has a convex sidewall.

19. The integrated circuit device of claim 17, wherein a first one of the plurality of segments has a first maximum width in a horizontal direction perpendicular to the longitudinal direction of the gate structure and a second one of the plurality of segments has a second maximum width in the horizontal direction, and wherein the second maximum width is greater than the first maximum width.

20. The integrated circuit device of claim 19, wherein the first one of the plurality of segments has a first thickness and the second one of the plurality of segments has a second thickness that is greater than the first thickness.

* * * * *